United States Patent
Kim et al.

(10) Patent No.: US 11,552,037 B2
(45) Date of Patent: Jan. 10, 2023

(54) SEMICONDUCTOR PACKAGE

(71) Applicant: Samsung Electronics Co., Ltd., Suwon-si (KR)

(72) Inventors: Namhoon Kim, Gunpo-si (KR); Seunghoon Yeon, Suwon-si (KR); Yonghoe Cho, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 126 days.

(21) Appl. No.: 17/193,435

(22) Filed: Mar. 5, 2021

(65) Prior Publication Data
US 2022/0037279 A1   Feb. 3, 2022

(30) Foreign Application Priority Data
Jul. 28, 2020   (KR) .......................... 10-2020-0093679

(51) Int. Cl.
*H01L 23/00*   (2006.01)
(52) U.S. Cl.
CPC .............. *H01L 24/20* (2013.01); *H01L 24/13* (2013.01); *H01L 2224/2101* (2013.01); *H01L 2224/214* (2013.01)
(58) Field of Classification Search
CPC ..................................................... H01L 24/20
See application file for complete search history.

(56) References Cited

U.S. PATENT DOCUMENTS

| | | | |
|---|---|---|---|
| 7,705,247 B2 | 4/2010 | Kim et al. | |
| 8,241,954 B2 | 8/2012 | Camacho et al. | |
| 9,263,511 B2* | 2/2016 | Yu ....................... | H01L 27/1255 |
| 2008/0211083 A1 | 9/2008 | Kang et al. | |
| 2010/0062600 A1 | 3/2010 | Utsuki | |
| 2019/0131235 A1 | 5/2019 | Wang et al. | |

FOREIGN PATENT DOCUMENTS

| | | |
|---|---|---|
| JP | H1187924 A | 3/1999 |
| JP | 4838977 B2 | 12/2011 |
| KR | 100467825 B1 | 1/2005 |

* cited by examiner

*Primary Examiner* — William A Harriston
(74) *Attorney, Agent, or Firm* — Muir Patent Law, PLLC

(57) ABSTRACT

Disclosed is a semiconductor package comprising a redistribution substrate, a semiconductor chip on the redistribution substrate and including a chip pad electrically connected to the redistribution substrate, and a conductive terminal on the redistribution substrate. The redistribution substrate includes a first dielectric layer, a first redistribution pattern, a second dielectric layer, a second redistribution pattern, and a first insulative pattern. The first redistribution pattern electrically connects the chip pad and the second redistribution pattern. The first insulative pattern has a first surface in contact with the first redistribution pattern and a second surface in contact with the second redistribution pattern. The second surface is opposite to the first surface. A width at the first surface of the first insulative pattern is the same as or greater than a width at the second surface of the first insulative pattern.

20 Claims, 20 Drawing Sheets

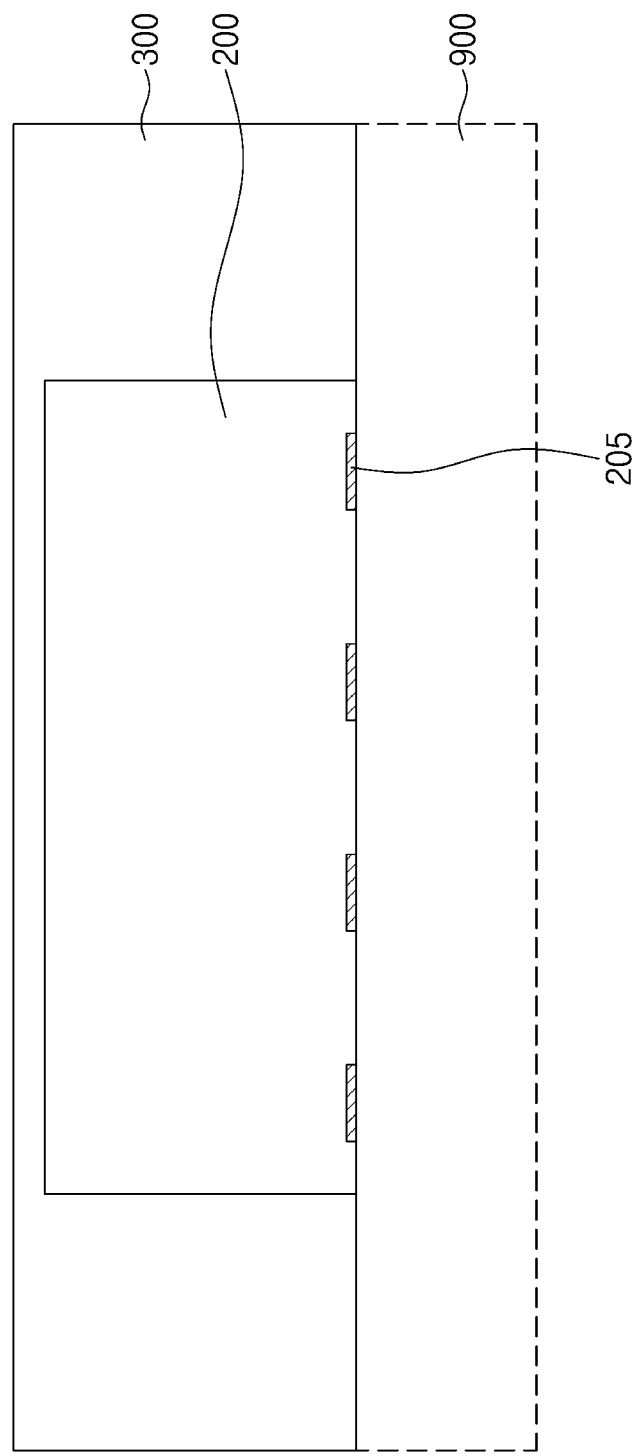

SEMICONDUCTOR PACKAGE

CROSS-REFERENCE TO RELATED APPLICATION

This U.S. nonprovisional application claims priority under 35 U.S.C § 119 to Korean Patent Application No. 10-2020-0093679 filed on Jul. 28, 2020 in the Korean Intellectual Property Office, the disclosure of which is hereby incorporated by reference in its entirety.

BACKGROUND

The present disclosure relates to a semiconductor package, and more particularly, to a semiconductor package including a redistribution substrate.

A semiconductor package is provided to implement an integrated circuit chip to qualify for use in electronic products. Typically, a semiconductor package is configured such that a semiconductor chip is mounted on a printed circuit board (PCB) and bonding wires or bumps are used to electrically connect the semiconductor chip to the printed circuit board. With the development of electronic industry, various researches have been conducted to improve reliability and durability of semiconductor packages.

SUMMARY

Some example embodiments of the present disclosure provides a semiconductor package with increased reliability.

According to some example embodiments of the present disclosure, a semiconductor package may comprise: a redistribution substrate; a semiconductor chip on a first surface of the redistribution substrate, the semiconductor chip including a chip pad electrically connected to the redistribution substrate; and a conductive terminal on a second surface, opposite to the first surface, of the redistribution substrate. The redistribution substrate may include: a first dielectric layer; a second dielectric layer in contact with the first dielectric layer; a third dielectric layer in contact with the second dielectric layer; a first redistribution pattern in the first dielectric layer and the second dielectric layer; a second redistribution pattern in the second dielectric layer and the third dielectric layer; and a first insulative pattern formed in a first recess region of the first redistribution pattern. The first redistribution pattern may be interposed between and electrically connect the chip pad and the second redistribution pattern. The first insulative pattern may have a first surface in contact with the first redistribution pattern and a second surface in contact with the second redistribution pattern. The second surface may be opposite to the first surface. A width at the first surface of the first insulative pattern may be the same as or greater than a width at the second surface of the first insulative pattern.

According to some example embodiments of the present disclosure, a semiconductor package may comprise: a redistribution substrate; a semiconductor chip on a first surface of the redistribution substrate, the semiconductor chip including a chip pad electrically connected to the redistribution substrate; and a conductive terminal on a second surface, opposite to the first surface, of the redistribution substrate. The redistribution substrate may include: a first dielectric layer, a second dielectric layer, a third dielectric layer, and a fourth dielectric layer that are sequentially provided in a direction from the first surface toward the second surface of the redistribution substrate; a first redistribution pattern in the first dielectric layer and the second dielectric layer, a second redistribution pattern in the second dielectric layer and the third dielectric layer, and a third redistribution pattern in the third dielectric layer and the fourth dielectric layer, the first to third redistribution patterns being sequentially provided along the direction and being connected to each other, each of the first to third redistribution patterns including a wire part that extends parallel to one surface of a corresponding one of the first to third dielectric layers, a via part that extends from the wire part and penetrates the corresponding one of the first to third dielectric layers, and a recess region in the wire part; a first insulative pattern in the recess region of the first redistribution pattern; and a second insulative pattern in the recess region of the second redistribution pattern. The first insulative pattern may have a first surface in contact with the via part of the first redistribution pattern. The second insulative pattern may have a second surface in contact with the via part of the second redistribution pattern. A width at the first surface of the first insulative pattern may be less than a width at the second surface of the second insulative pattern.

According to some example embodiments of the present disclosure, a semiconductor package may comprise: a redistribution substrate; a semiconductor chip on a first surface of the redistribution substrate, the semiconductor chip including a chip pad electrically connected to the redistribution substrate; a molding layer that covers the semiconductor chip; and a conductive terminal on a second surface, opposite to the first surface, of the redistribution substrate. The redistribution substrate may include: a dielectric layer; first, second, and third redistribution patterns in the dielectric layer and sequentially provided in a first direction from the first surface toward the second surface of the redistribution substrate, each of the first to third redistribution patterns including a wire part that extends parallel to one surface of the dielectric layer, a via part that extends from the wire part in a direction opposite to the first direction, and a recess region in the wire part; an under-bump pattern in the recess region of the third redistribution pattern and electrically connected to the conductive terminal; a first insulative pattern in the recess region of the first redistribution pattern; and a second insulative pattern in the recess region of the second redistribution pattern. The first insulative pattern may have a first surface in contact with the via part of the first redistribution pattern and a second surface in contact with the second redistribution pattern. The second surface may be opposite to the first surface. The second insulative pattern may have a third surface in contact with the via part of the second redistribution pattern and a fourth surface in contact with the third redistribution pattern. The fourth surface may be opposite to the third surface. A width at the first surface of the first insulative pattern may be the same as or greater than a width at the second surface of the first insulative pattern. A width at the third surface of the second insulative pattern may be the same as or greater than a width at the fourth surface of the second insulative pattern.

BRIEF DESCRIPTION OF THE DRAWINGS

FIGS. 2A to 2F, 2H, and 2I illustrate cross-sectional views showing a method of fabricating a semiconductor package according to some example embodiments of the present disclosure.

DETAILED DESCRIPTION OF EMBODIMENTS

Figure 1A:
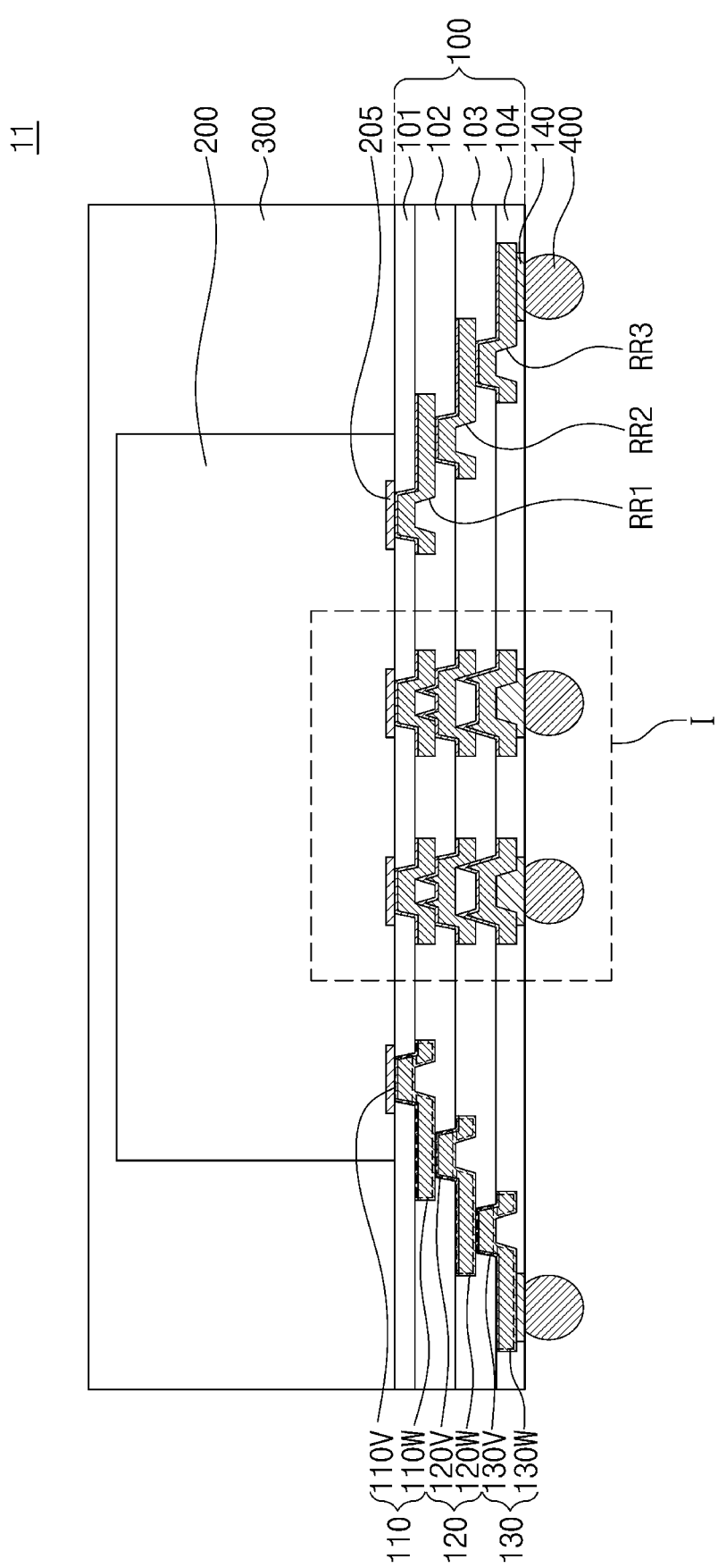
FIG. 1A illustrates a cross-sectional view showing a semiconductor package according to some example embodiments of the present disclosure.
Figure 1B:
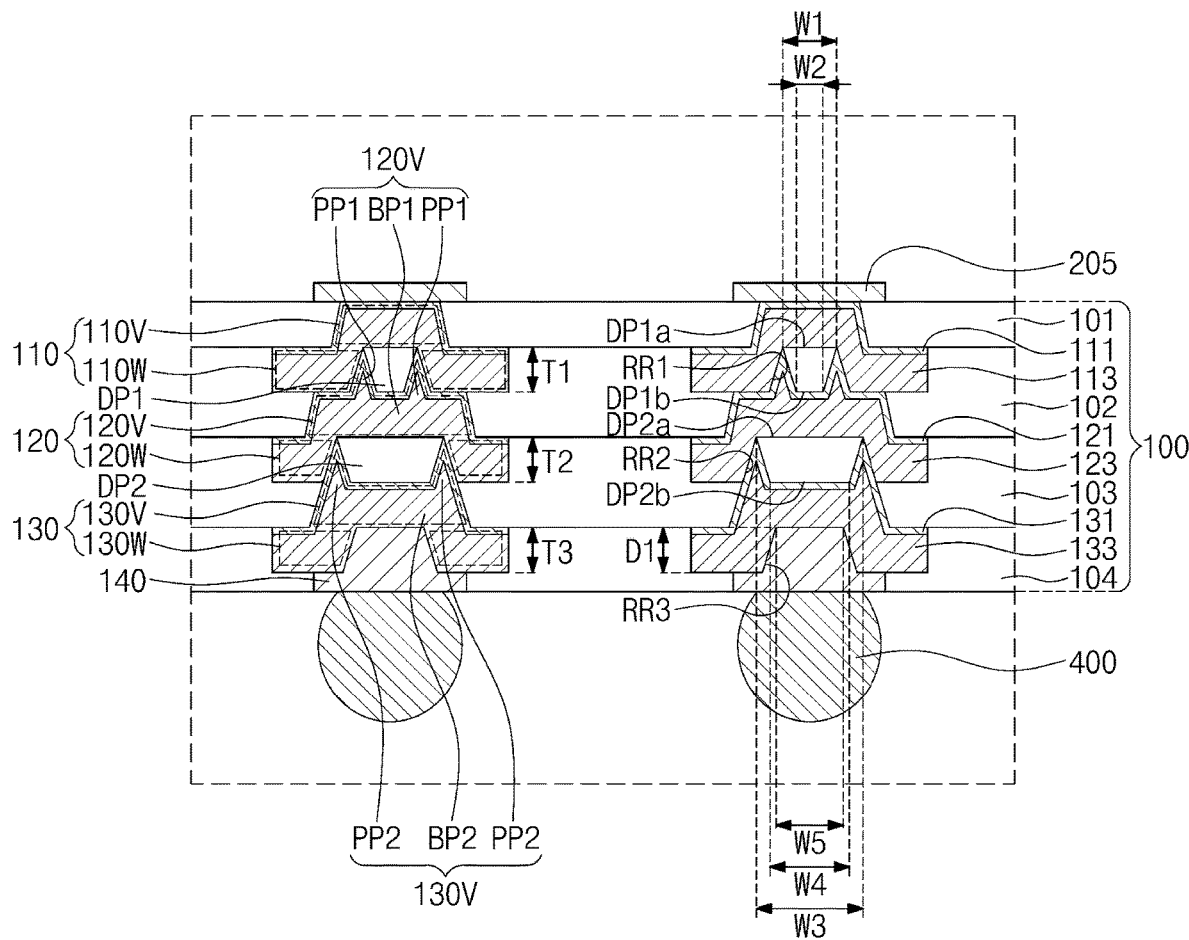
FIG. 1B illustrates an enlarged view showing section I of FIG. 1A.

FIG. 1A illustrates a cross-sectional view showing a semiconductor package according to some example embodiments of the present disclosure. FIG. 1B illustrates an enlarged view showing section I of FIG. 1A.

Referring to FIGS. 1A and 1B, a semiconductor package 11 may include a redistribution substrate 100 and a semiconductor chip 200. The redistribution substrate 100 may include a first redistribution pattern 110, a second redistribution pattern 120, a third redistribution pattern 130, a first insulative pattern DP1, a second insulative pattern DP2, an under-bump pattern 140, and dielectric layers 101, 102, 103, and 104. The dielectric layers 101, 102, 103, and 104 may include a first dielectric layer 101, a second dielectric layer 102, a third dielectric layer 103, and a fourth dielectric layer 104 that are vertically stacked. The redistribution substrate 100 may be called a wire structure. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The semiconductor chip 200 may be mounted on the redistribution substrate 100. The semiconductor chip 200 may include a chip pad 205. The chip pad 205 may be exposed on a bottom surface of the semiconductor chip 200. It will be appreciated that when an element is described to be connected, coupled or in contact with a chip pad, that element may be connected to the semiconductor chip as well as internal circuitry of the integrated circuit formed with the semiconductor chip.

The first redistribution pattern 110 may be provided in the first dielectric layer 101 and the second dielectric layer 102. For example, the first redistribution pattern 110 may include a first via part 110V in the first dielectric layer 101 and a first wire part 110W in the second dielectric layer 102. The first redistribution pattern 110 may be in contact with the chip pad 205. The first redistribution pattern 110 may electrically connect the chip pad 205 to the second redistribution pattern 120 which will be discussed below. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The first dielectric layer 101 may include an organic material, such as a photosensitive polymer. In this description, the photosensitive polymer may include or may be formed of, for example, one or more of photosensitive polyimide, polybenzoxazole, phenolic polymers, and benzocyclobutene polymers. The first dielectric layer 101 may be a positive photosensitive polymer, but the present inventive concepts are not limited thereto.

The first via part 110V may be provided in the first dielectric layer 101. The first via part 110V may penetrate the first dielectric layer 101. For example, the first dielectric layer 101 may have a top surface coplanar with that of the first via part 110V. The first dielectric layer 101 may cover a sidewall of the first via part 110V. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The first wire part 110W may be provided on one surface of the first via part 110V and may be connected to the first via part 110V. The first wire part 110W may be provided on one surface of the first dielectric layer 101 and may extend parallel to the one surface of the first dielectric layer 101. The first wire part 110W may have a thickness T1 of about 3 μm to about 15 μm. The first via part 110V may extend from the first wire part 110W into the first dielectric layer 101.

The first redistribution pattern 110 may include a first seed pattern 111 and a first conductive layer 113. The first conductive layer 113 may be provided on one surface of the first dielectric layer 101 and inside the first dielectric layer 101. The first conductive layer 113 may include or may be formed of a metal, such as copper. The first seed pattern 111 may be interposed between the chip pad 205 and the first conductive layer 113 and between the first dielectric layer 101 and the first conductive layer 113. The first seed pattern 111 may be in contact with the chip pad 205. The first seed pattern 111 may include or may be formed of a conductive material, such as copper, titanium, or any alloy thereof.

The first via part 110V and the first wire part 110W may each include the first seed pattern 111 and the first conductive layer 113. The first seed pattern 111 of the first via part 110V may be directly connected to the first seed pattern 111 of the first wire part 110W, with no boundary therebetween. For example, a first portion of the first seed pattern 111 may be provided between the chip pad 205 and a top surface of the first conductive layer 113 included in the first via part 110V, a second portion of the first seed pattern 111 may be provided between the first dielectric layer 101 and a sidewall of the first conductive layer 113 included in the first via part 110V, and a third portion of the first seed pattern 111 may be provided between the first dielectric layer 101 and a top surface of the first conductive layer 113 included in the first wire part 110W with no boundary between the first portion, the second portion, and the third portion of the first seed pattern 111. The first seed pattern 111 may not extend onto a sidewall and a bottom surface of the first conductive layer 113 included in the first wire part 110W. The first conductive layer 113 of the first via part 110V may be directly connected to the first conductive layer 113 of the first wire part 110W.

A first recess region RR1 may be provided in a portion of the first wire part 110W that is located below the first via part 110V of the first redistribution pattern 110. The first recess region RR1 may be recessed from the first wire part 110W toward the first via part 110V. The first recess region RR1 may extend toward the first via part 110V. The first recess region RR1 may be defined by a portion of the bottom surface of the first via part 110V and inclined inner walls of the first wire part 110W. The first recess region RR1 may have a tapered shape. For example, the first recess region RR1 may have a width that gradually decreases as the first recess region RR1 approaches the first via part 110V from the first wire part 110W. The first recess region RR1 may expose the bottom surface of the first via part 110V. The first recess region RR1 may have one surface at substantially the same level as that of a bottom surface of the first dielectric layer 101. For example, the first recess region RR1 may have a top surface at substantially the same level as the bottom surface of the first dielectric layer 101. In another example, the first recess region RR1 may have a top surface at a different level from that of the bottom surface of the first dielectric layer 101. Spatially relative terms, such as "beneath," "below," "lower," "above," "upper" and the like, may be used herein for ease of description to describe relative positional relationships, such as illustrated in the figures, e.g. It will be understood that the spatially relative terms encompass different orientations of the device in addition to the orientation depicted in the figures.

The first insulative pattern DP1 may be provided in at least one first recess region RR1. The first insulative pattern DP1 may contact the first via part 110V, but may not contact the first wire part 110W. In one embodiment, the first insulative pattern DP1 may cover a portion of the bottom surface of the first via part 110v. In another embodiment the first insulative pattern DP1 may completely cover the bottom surface of the first via part 110V. The first insulative pattern DP1 may be spaced apart from the inclined inner walls of the first wire part 110W that define the first recess region RR1. The first insulative pattern DP1 may be located at substantially the same level as that of the first wire part 110W. For example, a first surface DP1a of the first insulative pattern DP1 may be substantially coplanar with a top surface of the third portion of the first seed pattern 111 and a second surface DP1b of the first insulative pattern DP1 may be substantially coplanar with a bottom surface of the first wire part 110W.

insulative The first surface DP1a of the first insulative pattern DP1 may be in contact with the first via part 110V. The insulative second surface DP1b of the first insulative pattern DP1 may be opposite to the first surface DP1a. The first insulative pattern DP1 may have a first width W1 at the first surface DP1a and a second width W2 at the second surface DP1b. For example, the first width W1 may be greater than the second width W2. In another example, not illustrated, the first width W1 may be substantially the same as the second width W2. Therefore, the first insulative pattern DP1 may be connected to the second dielectric layer 102 which will be discussed below, and thus it may be possible to prevent non-exposure of a bottom surface of the first redistribution pattern 110. The first width W1 may be a maximum width of the first insulative pattern DP1. The first width W1 may range, for example, from about 10 μm to about 200 μm. The first insulative pattern DP1 may include or may be formed of the same material as that of the first, second, third, and fourth dielectric layers 101, 102, 103, and 104. The first insulative pattern DP1 may be patterned from the same insulative layer as the second dielectric layer 102. The first insulative pattern DP1 may be surrounded by the first redistribution pattern 110 and the second redistribution pattern 120. The second insulative pattern DP2 may be surrounded by the second redistribution pattern 120 and the third redistribution pattern 130. The first insulative pattern DP1 may be spaced apart with the second dielectric layer 102. The second insulative pattern DP2 may be spaced apart with the third dielectric layer 103.

The second dielectric layer 102 may be provided on one surface of the first dielectric layer 101. For example, the second dielectric layer 102 may cover the bottom surface of the first dielectric layer 101, and may also cover a bottom surface and a sidewall of the first wire part 110W. The second dielectric layer 102 may be in contact with at least a portion of the bottom surface of the first conductive layer 113. The second dielectric layer 102 may include or may be formed of, for example, a photosensitive polymer. The first and second dielectric layers 101 and 102 may have an indistinct boundary therebetween, but the present inventive concepts are not limited thereto.

The second redistribution pattern 120 may be provided on and electrically connected to the first redistribution pattern 110. The second redistribution pattern 120 may include a second wire part 120W and a second via part 120V. The second via part 120V may be provided in the second dielectric layer 102.

The second wire part 120W may be provided on the second via part 120V and one surface of the second dielectric layer 102. The second via part 120V may be interposed between the first redistribution pattern 110 and the second wire part 120W. The second wire part 120W may be electrically connected to the second via part 120V. The second wire part 120W may have a thickness T2 of about 3 μm to about 15 μm.

The second via part 120V may include a first body portion BP1 that extends parallel to the second wire part 120W, and may also include first protrusion portions PP1 that extend from the first body portion BP1 into the first recess region RR1. For example, the first body portion BP1 may be in contact with at least a portion of the bottom surface of the first wire part 110W. As such, the presence of the first insulative pattern DP1 may reduce a depth of a second recess region RR2 which will be discussed below, and may also reduce a resistance between the first and second redistribution patterns 110 and 120.

The second surface DP1b of the first insulative pattern DP1 may be in contact with the first body portion BP1. The first protrusion portions PP1 may be interposed between the first insulative pattern DP1 and the first wire part 110W of the first redistribution pattern 110. The first protrusion portions PP1 may be in contact with a sidewall of the first insulative pattern DP1. For example, the first insulative pattern DP1 may be interposed between the first redistribution pattern 110 and the second redistribution pattern 120. The first protrusion portions PP1 may be in contact with the inclined inner walls of the first wire part 110W. An interval between the first protrusion portions PP1 may be substantially the same as the first width W1. The first protrusion portions PP1 may be integrally formed with each other.

The second redistribution pattern 120 may include a second seed pattern 121 and a second conductive layer 123. For example, each of the second via part 120V and the second wire part 120W of the second redistribution pattern 120 may include the second seed pattern 121 and the second conductive layer 123. The second seed pattern 121 of the second via part 120V may be directly connected to the second seed pattern 121 of the second wire part 120W, with no boundary therebetween. For example, a first portion of the second seed pattern 121 may be provided between the first redistribution pattern 110 and a top surface of the second conductive layer 123 included in the second via part 120V, a second portion of the second seed pattern 121 may be provided between the second dielectric layer 102 and a sidewall of the second conductive layer 123 included in the second via part 120V, and a third portion of the second seed pattern 121 may be provided between the second dielectric layer 102 and a top surface of the second conductive layer 123 included in the second wire part 120W with no boundary between the first portion, the second portion, and the third portion of the second seed pattern 121. In another example, a first portion of the second seed pattern 121 may be interposed between the second dielectric layer 102 and a top surface of the second wire part 120W, a second portion of the second seed pattern 121 may be interposed between the second dielectric layer 102 and a sidewall of the first body portion BP1, a third portion of the second seed pattern 121 may be interposed between the first wire part 110W and a top surface of the first body portion BP1, a fourth portion of the second seed pattern 121 may be interposed between the first protrusion portions PP1 and inner walls of the first wire part 110W, a fifth portion of the second seed pattern 121 may be interposed between the first protrusion portions PP1 and the first insulative pattern DP1, and sixth portion of the second seed pattern 121 may be interposed between the first body portion BP1 and the first insulative pattern DP1 with no boundary between the first portion, the second portion, the third portion, the fourth portion, the fifth portion, and the sixth portion of the second seed pattern 121. The second seed pattern 121 may not extend onto a sidewall and a bottom surface of the second conductive layer 123 included in the second wire part 110W. The second conductive layer 123 of the second via part 120V may be directly connected to the second conductive layer 123 of the second wire part 120W.

A second recess region RR2 may be provided in a portion of the second wire part 120W that is located below the second via part 120V of the second redistribution pattern 120. The second recess region RR2 may be recessed from the second wire part 120W toward the second via part 120V. The second recess region RR2 may extend toward the second via part 120V. The second recess region RR2 may be defined by a portion of the bottom surface of the second via part 120V and inclined inner walls of the second wire part 120W.

The second recess region RR2 corresponding to the second insulative pattern DP2 may have a maximum width greater than that of the first recess region RR1. The second recess region RR2 may have a tapered shape. For example, the second recess region RR2 may have a width that gradually decreases as the second recess region RR2 approaches the second via part 120V from the second wire part 120W. The second recess region RR2 may expose the bottom surface of the second via part 120V. The second recess region RR2 may have one surface at substantially the same level as that of a bottom surface of the second dielectric layer 102. For example, the second recess region RR2 may have a top surface at substantially the same level as that of the bottom surface of the second dielectric layer 102. In another example, the second recess region RR2 may have a top surface at a different level from that of the bottom surface of the second dielectric layer 102.

The second insulative pattern DP2 may be provided in at least one second recess region RR2. The second insulative pattern DP2 may contact the second via part 120V, but may not contact the second wire part 120W. In one embodiment, the second insulative pattern DP2 may cover a portion of the bottom surface of the second via part 120V. In another embodiment, the second insulative pattern DP2 may completely cover the bottom surface of the second via part 120V. The second insulative pattern DP2 may be spaced apart from the inclined inner walls of the second wire part 120W that define the second recess region RR2. The second insulative pattern DP2 may be located at substantially the same level as that of the second wire part 120W. For example, a third surface DP2*a* of the second insulative pattern DP2 may be substantially coplanar with a top surface of the second seed pattern 121 between the second dielectric layer 102 and the second wire part 120W and a fourth surface DP2*b* of the second insulative pattern DP2 may be substantially coplanar with a bottom surface of the second wire part 120W.

The insulative third surface DP2*a* of the second insulative pattern DP2 may be in contact with the second via part 120V. The insulative fourth surface DP2*b* of the second insulative pattern DP2 may be opposite to the third surface DP2*a*. The second insulative pattern DP2 may have a third width W3 at the third surface DP2*a* and a fourth width W4 at the fourth surface DP2*b*. For example, the third width W3 may be greater than the fourth width W4. In another example, not illustrated, the third width W3 may be substantially the same as the fourth width W4. Therefore, the second insulative pattern DP2 may be connected to the third dielectric layer 103 which will be discussed below, and thus it may be possible to prevent non-exposure of a bottom surface of the second redistribution pattern 120. The third width W3 may be a maximum width of the second insulative pattern DP2. The third width W3 may range, for example, from about 20 μm to about 400 μm. The first width W1 may be less than the third width W3. The second insulative pattern DP2 may include or may be formed of the same material as that of the first, second, third, and fourth dielectric layers 101, 102, 103, and 104.

For example, the first and second insulative patterns DP1 and DP2 may have substantially the same thickness as each other. In another example, not illustrated, the first and second insulative patterns DP1 and DP2 may have different thicknesses from each other. The thickness of the first insulative pattern DP1 may be defined as a vertical distance from the first surface DP1*a* to the second surface DP1*b*. The thickness of the second insulative pattern DP2 may be defined as a vertical distance from the third surface DP2*a* to the fourth surface DP2*b*.

The third dielectric layer 103 may be provided on one surface of the second dielectric layer 102. For example, the third dielectric layer 103 may cover the bottom surface of the second dielectric layer 102, and may also cover a bottom surface and a sidewall of the second wire part 120W. The third dielectric layer 103 may include or may be formed of, for example, a photosensitive polymer. The second and third dielectric layers 102 and 103 may have an indistinct boundary therebetween, but the present inventive concepts are not limited thereto.

The third redistribution pattern 130 may be provided on one surface of the second redistribution pattern 120, and may be electrically connected to the second redistribution pattern 120. The third redistribution pattern 130 may include a third wire part 130W and a third via part 130V. The third via part 130V may be provided in the third dielectric layer 103.

The third wire part 130W may be provided on the third via part 130V and one surface of the third dielectric layer 103. The third via part 130V may be interposed between the second redistribution pattern 120 and the third wire part 130W. The third wire part 130W may be electrically connected to the third via part 130V. The third wire part 130W may have a thickness T3 of about 3 μm to about 15 μm.

The third via part 130V may include a second body portion BP2 that extends parallel to the third wire part 130W, and may also include second protrusion portions PP2 that extend from the second body portion BP2 into the second recess region RR2. The second protrusion portions PP2 may be interposed between the second insulative pattern DP2 and the second wire part 120W of the second redistribution pattern 120. The second protrusion portions PP2 may be in contact with a sidewall of the second insulative pattern DP2. For example, the second insulative pattern DP2 may be interposed between the second redistribution pattern 120 and the third redistribution pattern 130. The second protrusion portions PP2 may be in contact with the inclined inner walls of the second wire part 120W. An interval between the second protrusion portions PP2 may be substantially the same as the third width W3. For example, the interval between the first protrusion portions PP1 may be less than the interval between the second protrusion portions PP2. The second protrusion portions PP2 may be integrally formed with each other.

The third redistribution pattern 130 may include a third seed pattern 131 and a third conductive layer 133. For example, each of the third via part 130V and the third wire part 130W of the third redistribution pattern 130 may include the third seed pattern 131 and the third conductive layer 133. The third seed pattern 131 of the third via part 130V may be directly connected to the third seed pattern 131 of the third wire part 130W, with no boundary therebetween. For example, a first portion of the third seed pattern 131 may be interposed between the second redistribution pattern 120 and a top surface of the third conductive layer 133 included in the third via part 130V, a second portion of the third seed pattern 131 may be interposed between the third dielectric layer 103 and a sidewall of the third conductive layer 133 included in the third via part 130V, and a third portion of the third seed pattern 131 may be interposed between the third dielectric layer 103 and a top surface of the third conductive layer 133 included in the third wire part 130W with no boundary between the first portion, the second portion, and the third portion of the third seed pattern 131. In another example, a first portion of the third seed pattern 131 may be interposed between the third dielectric layer 103 and a top surface of the third wire part 130W, a second portion of the third seed pattern 131 may be interposed between the third dielectric layer 103 and a sidewall of the second body portion BP2, a third portion of the third seed pattern 131 may be interposed between the second protrusion portions PP2 and inner walls of the second wire part 120W, a fourth portion of the third seed pattern 131 may be interposed between the second protrusion portions PP2 and the second insulative pattern DP2, and a fifth portion of the third seed pattern 131 may be interposed between the second body portion BP2 and the second insulative pattern DP2 with no boundary between the first portion, the second portion, the third portion, the fourth portion, and the fifth portion of the third seed pattern 131. The third seed pattern 131 may not extend onto a sidewall and a bottom surface of the third conductive layer 133 included in the third wire part 130W.

The third conductive layer 133 of the third via part 130V may be directly connected to the third conductive layer 133 of the third wire part 130W.

A third recess region RR3 may be provided in a portion of the third via part 130V that is located below the third wire part 130W of the third redistribution pattern 130. The third recess region RR3 may be recessed from the third wire part 130W toward the third via part 130V. The third recess region RR3 may extend toward the third via part 130V. The third recess region RR3 may be defined by a bottom surface of the third via part 130V and inclined inner walls of the third wire part 130W. The third recess region RR3 may have a tapered shape. For example, the third recess region RR3 may have a width that gradually decreases as the third recess region RR3 approaches the third via part 130V from the third wire part 130W. The third recess region RR3 may expose the bottom surface of the third via part 130V. The third recess region RR3 may have one surface at substantially the same level as that of a bottom surface of the third dielectric layer 103. For example, the third recess region RR3 may have a top surface at substantially the same level as that of the bottom surface of the third dielectric layer 103. In another example, the third recess region RR3 may have a top surface at a different level from that of the bottom surface of the third dielectric layer 103.

The third recess region RR3 may have a depth D1 of about 3 μm to about 20 μm. The depth D1 of the third recess region RR3 may be defined as a vertical distance from a bottom surface of the third wire part 130W to the bottom surface of the third via part 130V. The second recess region RR2 may have a depth that is defined as a vertical distance from the bottom surface of the second wire part 120W to the bottom surface of the second via part 120V. The first recess region RR1 may have a depth that is defined as a vertical distance from the bottom surface of the first wire part 110W to the bottom surface of the first via part 110V. For example, the depths of the first, second, and third recess regions RR1, RR2, and RR3 may be substantially the same as each other. A fifth width W5 may be given as a minimum width of the third recess region RR3. For example, the fifth width W5 may be less than the third width W3.

Referring back to FIG. 1B, the second via part 120V may have a maximum width greater than that of the first via part 110V and substantially the same as that of the third via part 130V. In another example, not illustrated, the second via part 120V may have a maximum width different from that of the third via part 130V.

A vertical alignment may be achieved between the first via part 110V, the second via part 120V, the third via part 130V, the first insulative pattern DP1, and the second insulative pattern DP2. For example, the redistribution substrate 100 may have a stack via structure. As the redistribution substrate 100 has the vertically aligned via structure, it may be possible to reduce a circuit design time and to prevent electrical degradation such as signal loss. In addition, it may be possible to increase integration of the semiconductor package 11.

The fourth dielectric layer 104 may be provided on one surface of the third dielectric layer 103. For example, the fourth dielectric layer 104 may cover at least portions of the sidewall and the bottom surface of the third wire part 130W. The fourth dielectric layer 104 may include or may be formed of, for example, a photosensitive polymer. The third and fourth dielectric layers 103 and 104 may have an indistinct boundary therebetween, but the present inventive concepts are not limited thereto.

The under-bump pattern 140 may be provided in the third recess region RR3 and/or the fourth dielectric layer 104. The under-bump pattern 140 may be coupled to the third redistribution pattern 130. The under-bump pattern 140 may have a bottom surface that is partially or completed uncovered by the fourth dielectric layer 104. The under-bump pattern 140 may serve as a pad for a conductive terminal 400 which will be discussed below. The under-bump pattern 140 may include or may be formed of a metallic material, such as copper. For example, the bottom surface of the under-bump pattern 140 may be coplanar with a bottom surface of the fourth dielectric layer 104. The bottom surface of the under-bump pattern 140 may have a flat surface. A minimum width of the under-bump pattern 140 may be substantially the same as the fifth width W5.

A conductive terminal 400 may be provided on a bottom surface of the redistribution substrate 100. For example, the conductive terminal 400 may be disposed on the bottom surface of the under-bump pattern 140, thereby being electrically connected to the under-bump pattern 140. The conductive terminal 400 may be in contact with the under-bump pattern 140. Therefore, the conductive terminal 400 may be electrically connected to the semiconductor chip 200 through the first, second, and third redistribution patterns 110, 120, and 130. The conductive terminal 400 may include a solder, a bump, a pillar, or a combination thereof. The conductive terminal 400 may include or may be formed of a solder material.

The semiconductor package 11 may further include a molding layer 300. The molding layer 300 may be disposed on the redistribution substrate 100, thereby covering the semiconductor chip 200. The molding layer 300 may cover an uppermost one of the first, second, third, and fourth dielectric layer 101, 102, 103, and 104. For example, the first dielectric layer 101 may be the uppermost one of the first, second, third, and fourth dielectric layers 101, 102, 103, and 104. The molding layer 300 may include or may be formed of a dielectric polymer, such as an epoxy molding compound.

Figure 1C:
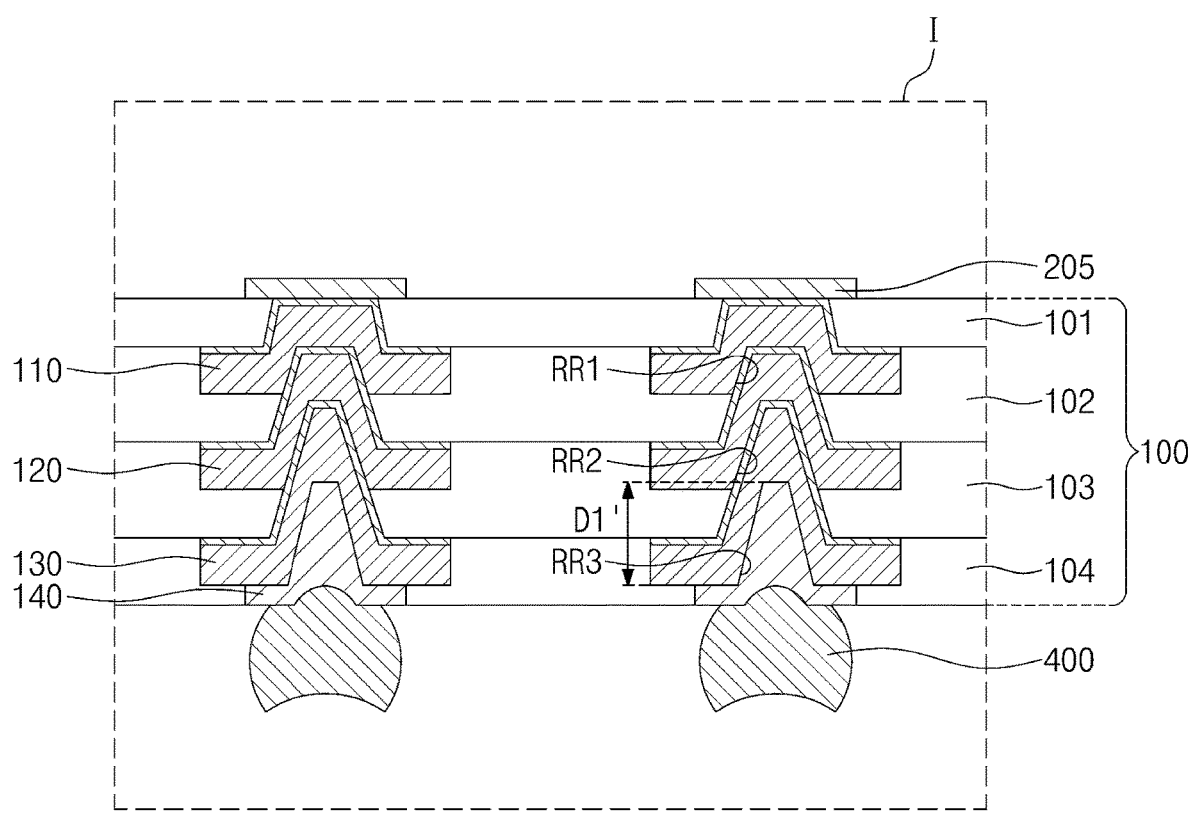
FIG. 1C illustrates an enlarged view of section I depicted in FIG. 1A, showing a semiconductor package according to a comparative example.

FIG. 1C illustrates an enlarged view of section I depicted in FIG. 1A, showing a semiconductor package according to a comparative example. A duplicate description will be omitted below.

Referring to FIG. 1C, as discussed with reference to FIGS. 1A and 1B, the redistribution substrate 100 may have a stack via structure. However, differently from that shown in FIG. 1B, FIG. 1C depicts an embodiment in which none of the insulative patterns DP1 and DP2 are provided in the recess regions RR1 and RR2. In this case, the second and third recess regions RR2 and RR3 may each have a depth greater than that shown in FIGS. 1A and 1B. The third recess region RR3 may have an increased depth D1', and thus the under-bump pattern 140 may have a curved shape at the bottom surface thereof. Therefore, the conductive terminal 400 attached to the bottom surface of the under-bump pattern 140 may not be formed to have a spherical shape. The shape defect of the conductive terminal 400 may induce contact failure between the conductive terminal 400 and an external circuit. In this case, a semiconductor package may reduce in reliability.

Referring back to FIGS. 1A and 1B, as the insulative patterns DP1 and DP2 are provided in the recess regions RR1 and RR2, there may be a reduction in the depth D1 of the third recess region RR3. Therefore, the conductive terminal 400 may be prevented from failure as discussed in FIG. 1C, which may result in prevention of contact failure between the conductive terminal 400 and an external circuit. As a result, the semiconductor package 11 in accordance with the example of FIG. 1B may increase in reliability.

FIGS. 2A to 2F, 2H, and 2I illustrate cross-sectional views showing a method of fabricating a semiconductor package according to some example embodiments of the present disclosure. FIG. 2G illustrates an enlarged view showing section II of FIG. 2F. A duplicate description will be omitted below.

Referring to FIG. 2A, a semiconductor chip 200 and a molding layer 300 may be disposed on a carrier substrate 900. One surface of the semiconductor chip 200 may face the carrier substrate 900. A chip pad 205 may be provided on the one surface of the semiconductor chip 200. The molding layer 300 may be formed on the carrier substrate 900, thereby covering at least a portion of the semiconductor chip 200. For example, the molding layer 300 may cover top and lateral surfaces of the semiconductor chip 200. Differently from that shown, the molding layer 300 may cover the lateral surface of the semiconductor chip 200, but may not cover or cover only a portion of the top surface of the semiconductor chip 200. The carrier substrate 900 may be removed to expose a surface of each of the semiconductor chip 200 and the molding layer 300. Afterwards, the semiconductor chip 200 and the molding layer 300 may be turned upside down.

Figure 2B:
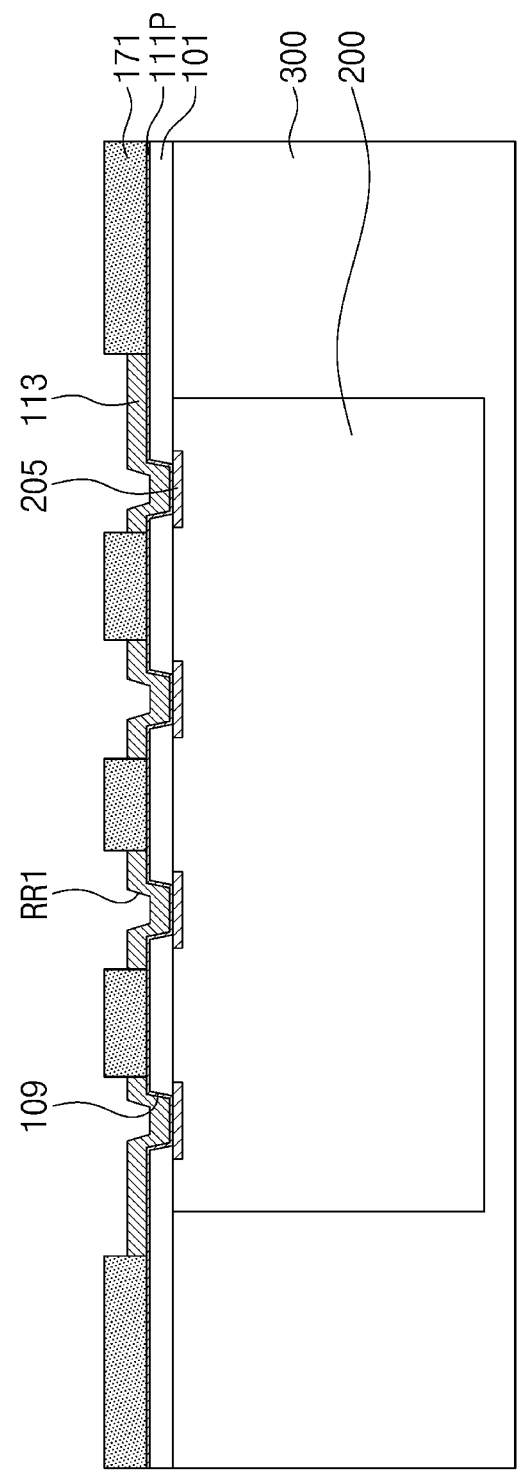

Referring to FIG. 2B, a first dielectric layer 101 may be formed on the semiconductor chip 200 and the molding layer 300. The first dielectric layer 101 may cover the exposed surface of each of the semiconductor chip 200 and the molding layer 300. The formation of the first dielectric layer 101 may be performed by a coating process, such as spin coating or slit coating. The first dielectric layer 101 may include or may be formed of, for example, a photosensitive polymer. The photosensitive polymer may include or may be formed of, for example, one or more of photosensitive polyimide, polybenzoxazole, phenolic polymers, and benzocyclobutene polymers.

The first dielectric layer 101 may be patterned to form a first hole 109 in the first dielectric layer 101. The patterning of the first dielectric layer 101 may be performed by exposure and development processes. The first hole 109 may expose a top surface of the chip pad 205. The first hole 109 may have a tapered shape. For example, the first hole 109 may have a diameter or width that is greater at its upper portion than at its lower portion. In this case, the lower portion of the first hole 109 may be adjacent to the chip pad 205. The first hole 109 may define an inner wall of the first dielectric layer 101. As the first hole 109 has a tapered shape, an obtuse angle may be provided between the inner wall of the first dielectric layer 101 and the top surface of the chip pad 205. The chip pad 205 and the first hole 109 may each be formed in plural.

A first seed layer 111P, a first resist pattern 171, and first conductive layers 113 may be formed on a top surface of the first dielectric layer 101. According to some example embodiments, the first seed layer 111P may be formed on the first dielectric layer 101 and in the first holes 109. The first seed layer 111P may conformally cover the top surface of the first dielectric layer 101, the inner wall of the first dielectric layer 101, and the exposed top surface of the chip pad 205.

The first resist pattern 171 may be formed on the first seed layer 111P. The formation of the first resist pattern 171 may include coating a photoresist material onto the first seed layer 111P. The first resist pattern 171 may be patterned to form first openings. The patterning of the first resist pattern 171 may be performed by exposure and development processes. The first openings may vertically overlap corresponding first holes 109. The first openings may have their widths greater than those of the corresponding first holes 109. Alternatively, the first openings may have their lengths greater than those of the corresponding first holes 109. Each of the first openings may have a sidewall substantially perpendicular to a bottom surface thereof. Each of the first openings may expose a portion of the first seed layer 111P.

The first conductive layers 113 may be formed in corresponding first holes 109, thereby covering the first seed layer 111P. The first conductive layers 113 may correspondingly fill lower portions of the first openings. For example, the first conductive layers 113 may fill the corresponding first holes 109 and may not extend onto a top surface of the first resist pattern 171. The first conductive layers 113 may be formed by performing an electroplating process in which the first seed layer 111P is used as an electrode. A planarization process may not be separately performed during the formation of the first conductive layers 113.

A first recess region RR1 may be defined on each of the first conductive layers 113. The first recess region RR1 may extend toward the first hole 109. The first recess region RR1 may vertically overlap the chip pad 205. The first recess region RR1 may define an inner wall of the first conductive layer 113. The first recess region RR1 may have a width that is greater at its upper portion than at its lower portion. For example, the first recess region RR1 may have a tapered shape.

Figure 2C:
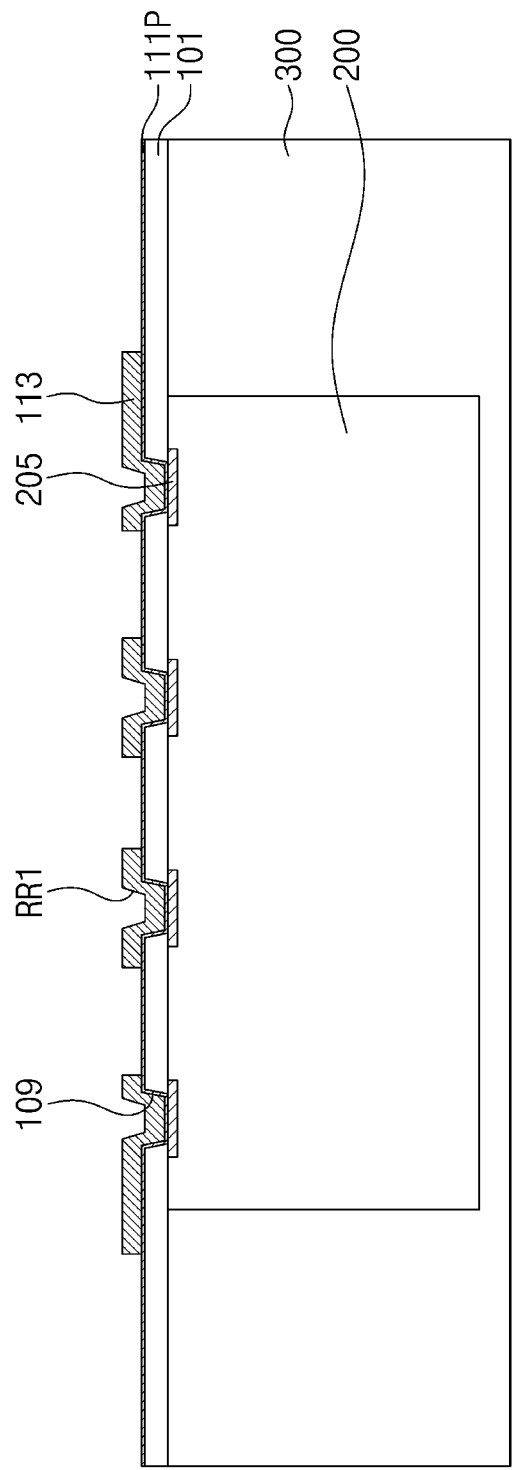

Referring to FIG. 2C, the first resist pattern 171 may be removed to expose top surfaces of first segments of the first seed layer 111P. A strip process may be performed to remove the first resist pattern 171.

Figure 2D:
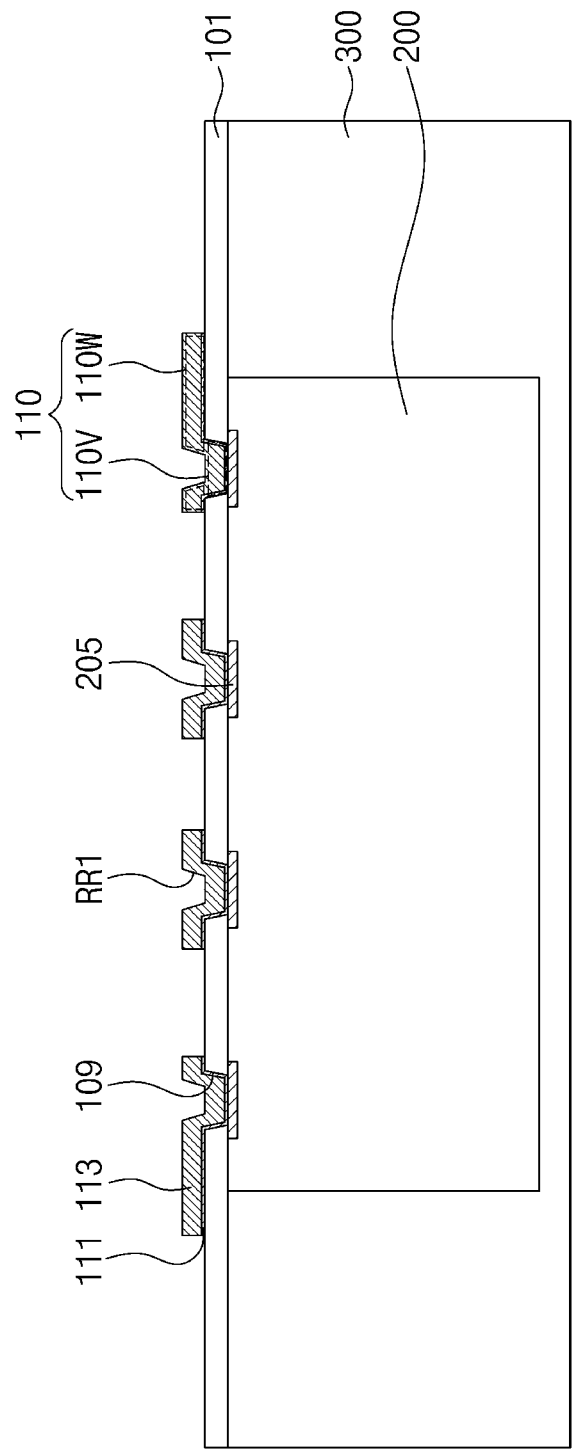

Referring to FIG. 2D, the exposed first segments of the first seed layer 111P may be removed to form first seed patterns 111. An etching process may be performed to remove the first segments from the first seed layer 111P. A wet etching process may be adopted as the etching process. In the etching process, the first conductive layers 113 may have an etch selectivity with respect to the first seed layer 111P. The first seed layer 111P may have second segments that are disposed on bottom surfaces of the first conductive layers 113 and are not exposed to the etching process. After the etching process is terminated, the remaining second segments of the first seed layer 111P may be formed into the first seed patterns 111. Therefore, first redistribution patterns 110 may be formed. The first redistribution patterns 110 may be laterally spaced apart from each other. Each of the first redistribution patterns 110 may include a first seed pattern 111 and a first conductive layer 113. The first conductive layers 113 may be disposed on corresponding first seed patterns 111. Each of the first redistribution patterns 110 may include a first via part 110V and a first wire part 110W. The first via part 110V may be provided in one of the first holes 109. The first recess region RR1 may be an area formed above the first via part 110V and in a portion of the first wire part 110W. The first recess region RR1 may be recessed from the first wire part 110W toward the first via part 110V.

Figure 2E:
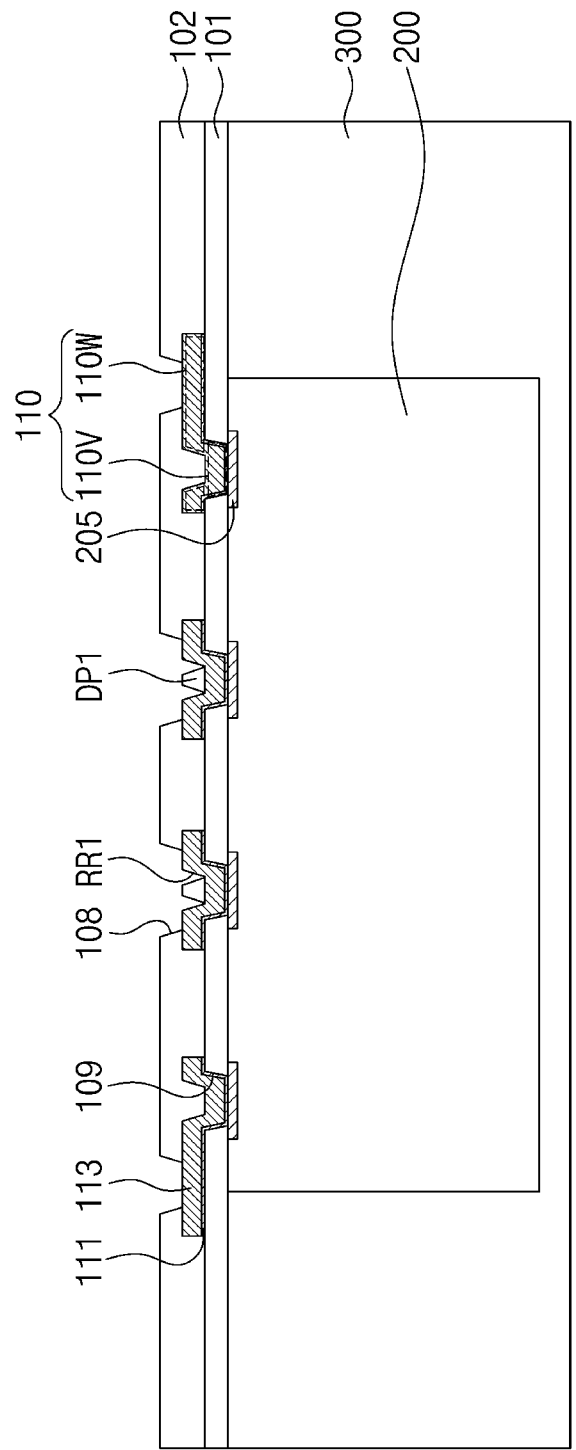

Referring to FIG. 2E, on the first dielectric layer 101, a second dielectric layer 102 may be formed to cover the first dielectric layer 101 and the first redistribution patterns 110. For example, the second dielectric layer 102 may cover top surfaces and sidewalls of the first redistribution patterns 110.

The second dielectric layer 102 may be patterned to form second holes 108 and first insulative patterns DP1. The first insulative pattern DP1 may be provided in at least one first recess region RR1. For example, the first insulative pattern DP1 may have at its top surface a width substantially the same as or less than a width at its bottom surface. A maximum width of the second hole 108 that corresponds to the first insulative pattern DP1 may be greater than a maximum width of the second hole 108 that does not correspond to the first insulative pattern DP1. Therefore, the first insulative pattern DP1 and the second dielectric layer 102 may be connected to prevent non-exposure of the top surface of the first redistribution pattern 110. The second holes 108 may have tapered shapes. For example, each of the second holes 108 may expose a top surface of the first wire part 110W. In another example, each of the second holes 108 may expose a top surface of the first wire part 110W, and may also expose the first recess region RR1.

Figure 2F:
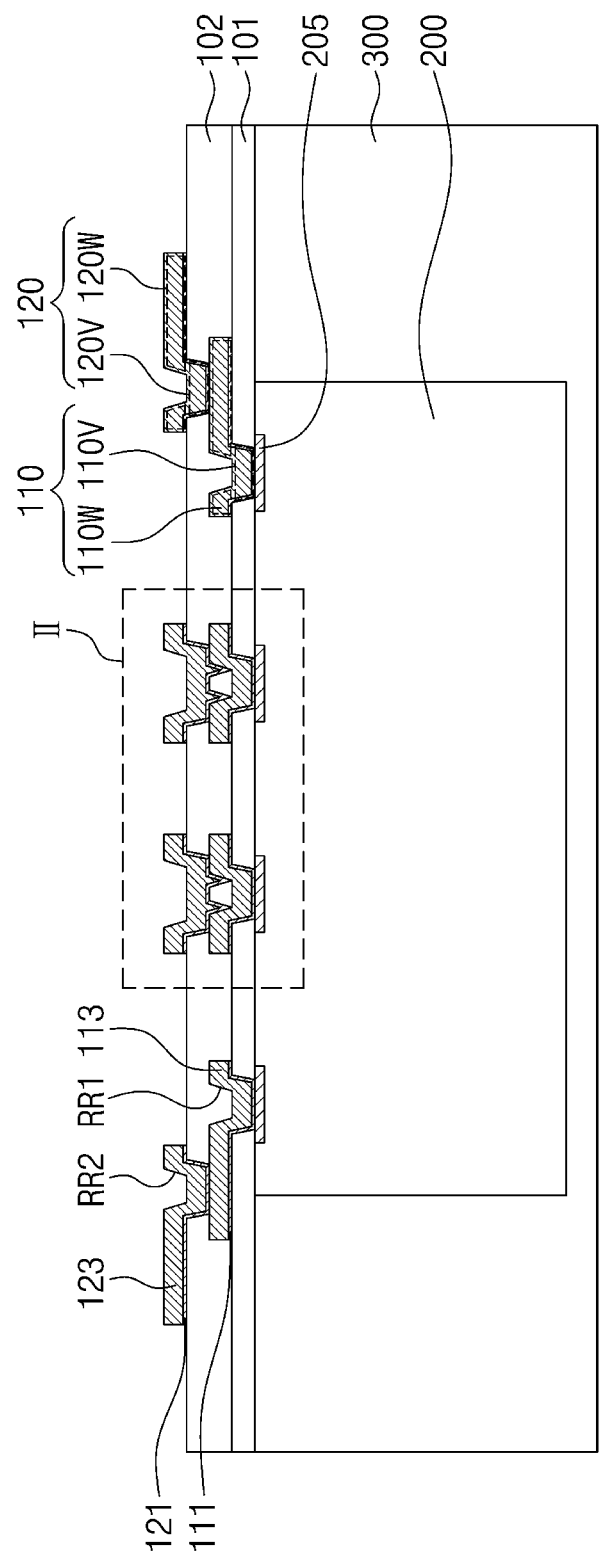
Figure 2G:
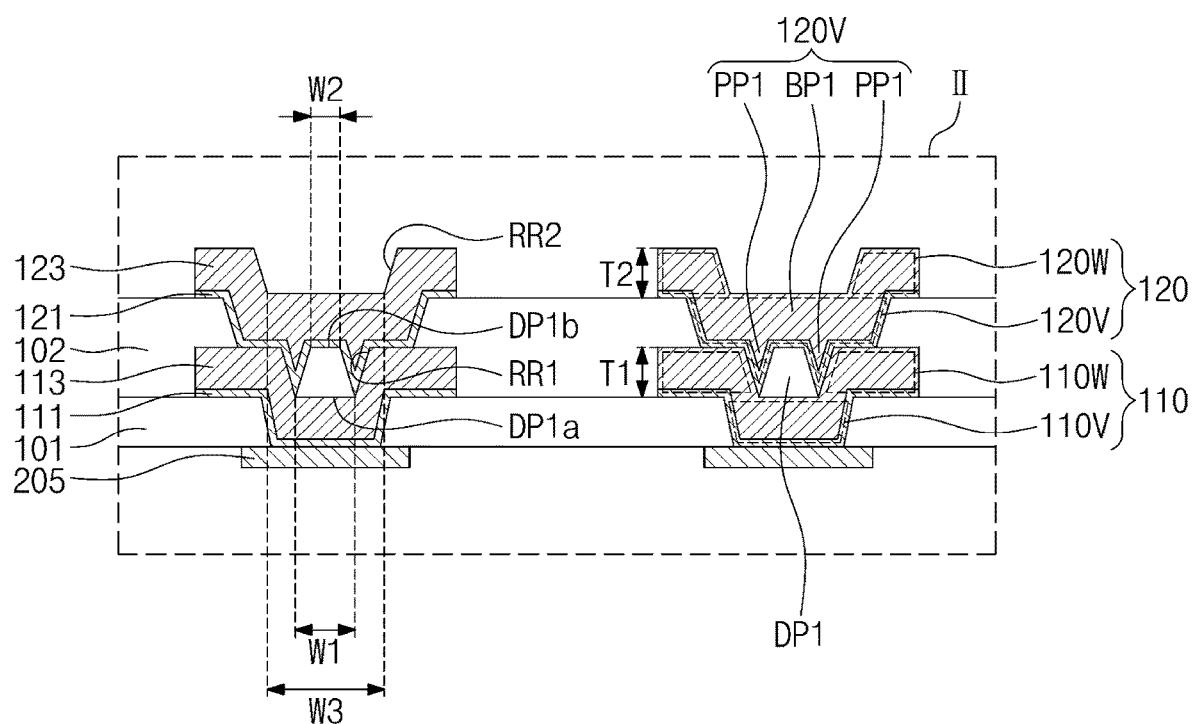
FIG. 2G illustrates an enlarged view showing section II of FIG. 2F.

Referring to FIG. 2F, second redistribution patterns 120 may be formed in corresponding second holes 108. The second redistribution patterns 120 may extend onto a top surface of the second dielectric layer 102. The second redistribution patterns 120 may be laterally spaced apart from each other. The second redistribution patterns 120 may be formed by the same method as that used for forming the first redistribution patterns 110. For example, the formation of the second redistribution patterns 120 may include forming a second seed layer, forming on the second seed layer a second resist pattern having second openings, forming second conductive layers 123 in the second holes 108 and the second openings, removing the second resist pattern to expose a portion of the second seed layer, and etching the exposed portion of the second seed layer to form second seed patterns 121. Each of the second redistribution patterns 120 may include the second seed pattern 121 and the second conductive layer 123. The second conductive layers 123 may be disposed on corresponding second seed patterns 121. Each of the second redistribution patterns 120 may include a second via part 120V and a second wire part 120W.

A second recess region RR2 may be defined on each of the second redistribution patterns 120. The second recess region RR2 may extend toward the second hole 108. The second recess region RR2 may define an inner wall of the second wire part 120W. The second recess region RR2 may have a width that is greater at its upper portion than at its lower portion. The second recess region RR2 may have a tapered shape. The second recess region RR2 corresponding to the first insulative pattern DP1 may have a maximum width greater than that of the first recess region RR1.

The first insulative pattern DP1 and the second redistribution pattern 120 will be further discussed in detail with reference to FIG. 2G. The first insulative pattern DP1 may have a first surface DP1a in contact with the first redistribution pattern 110 and a second surface DP1b opposite to the first surface DP1a. The first insulative pattern DP1 may have a first width W1 at the first surface DP1a. The first insulative pattern DP1 may have a second width W2 at the second surface DP1b. For example, the first width W1 may be greater than the second width W2. In another example, not illustrated, the first width W1 may be substantially the same as the second width W2. The first width W1 may be a maximum width of the first insulative pattern DP1.

The second via part 120V may include a first body portion BP1 that extends parallel to the second wire part 120W, and may also include first protrusion portions PP1 that extend from the first body portion BP1 into the first recess region RR1. The first body portion BP1 may be in contact with at least a portion of the top surface of the first wire part 110W. The second surface DP1b of the first insulative pattern DP1 may be in contact with the first body portion BP1. The first protrusion portions PP1 may be interposed between the first insulative pattern DP1 and the first wire part 110W of the first redistribution pattern 110. The first protrusion portions PP1 may be in contact with a sidewall of the first insulative pattern DP1. For example, the first insulative pattern DP1 may be interposed between the first redistribution pattern 110 and the second redistribution pattern 120. The first protrusion portions PP1 may be in contact with inclined inner walls of the first wire part 110W. An interval between the first protrusion portions PP1 may be substantially the same as the first width W1. A minimum width of the second recess region RR2 may be substantially the same as a third width W3 of a second insulative pattern DP2 which will be discussed below. The first width W1 may be less than the third width W3. The first protrusion portions PP1 may be integrally formed with each other.

Figure 2H:
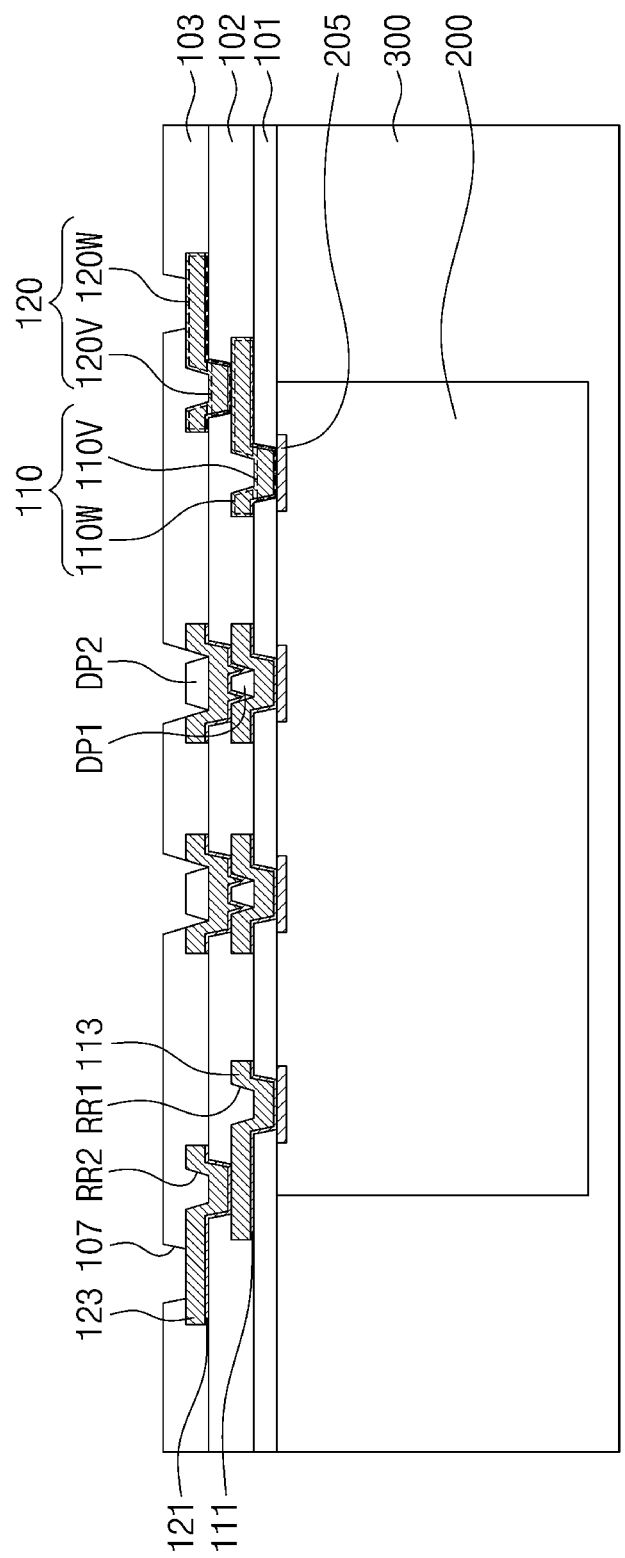

Referring to FIG. 2H, on the second dielectric layer 102, a third dielectric layer 103 may be formed to cover the second dielectric layer 102 and the second redistribution patterns 120. For example, the third dielectric layer 103 may cover top surfaces and sidewalls of the second redistribution patterns 120.

The third dielectric layer 103 may be patterned to form third holes 107 and second insulative patterns DP2. The second insulative pattern DP2 may be provided in at least one second recess region RR2. For example, the second insulative pattern DP2 may have at its top surface a width substantially the same as or less than a width at its bottom surface. A maximum width of the third hole 107 that corresponds to the second insulative pattern DP2 may be greater than a maximum width of the third hole 107 that does not correspond to the second insulative pattern DP2. Therefore, the second insulative pattern DP2 and the third dielectric layer 103 may be connected to prevent non-exposure of the top surface of the second redistribution pattern 120. The third holes 107 may have tapered shapes. For example, each of the third holes 107 may expose a top surface of the second wire part 120W. For another example, each of the third holes 107 may expose a top surface of the second wire part 120W, and may also expose the second recess region RR2.

Figure 2I:
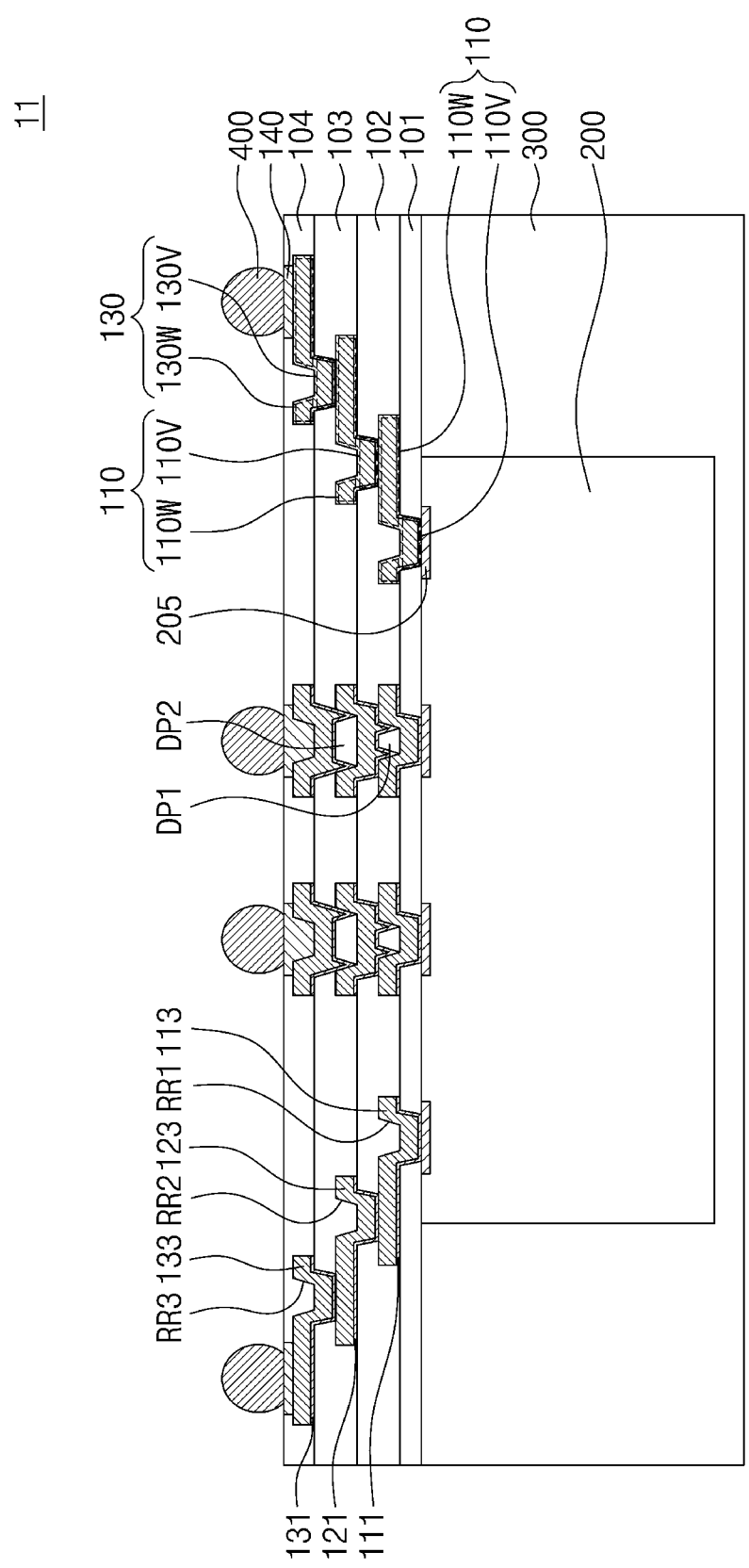

Referring to FIG. 2I, third redistribution patterns 130 may be formed in corresponding third holes 107. The third redistribution patterns 130 may extend onto a top surface of the third dielectric layer 103. The third redistribution patterns 130 may be laterally spaced apart from each other. The third redistribution patterns 130 may be formed by the same method as that used for forming the first redistribution patterns 110. For example, the formation of the third redistribution patterns 130 may include forming a third seed layer, forming on the third seed layer a third resist pattern having third openings, forming third conductive layers 133 in the third holes 107 and the third openings, removing the third resist pattern to expose the third seed layer, and etching the exposed portion of the third seed layer to form third seed patterns 131. Each of the third redistribution patterns 130 may include the third seed pattern 131 and the third conductive layer 133. Each of the third redistribution patterns 130 may include a third via part 130V and a third wire part 130W.

A third recess region RR3 may be defined on each of the third redistribution patterns 130. The third recess region RR3 may extend toward the third hole 107. The third recess region RR3 may define an inner wall of the third wire part 130W. The third recess region RR3 may have a width that is greater at its upper portion than at its lower portion. The third recess region RR3 may have a tapered shape. A maximum width of the third recess region RR3 that corresponds to the second insulative pattern DP2 may be less than a maximum width of the second recess region RR2 that corresponds to the second insulative pattern DP2.

Thereafter, on the third dielectric layer 103, a fourth dielectric layer 104 may be formed to cover the third redistribution patterns 130 and the top surface of the third dielectric layer 103. The fourth dielectric layer 104 may be formed by substantially the same method as that used for forming the first dielectric layer 101.

Under-bump patterns 140 may be formed on top surfaces of the third redistribution patterns 130. The under-bump patterns 140 may fill the third recess regions RR3 that correspond to the insulative patterns DP1 and DP2. The fourth dielectric layer 104 may cover none of or only portions of top surfaces of the under-bump patterns 140. For example, subsequent to forming the fourth dielectric layer 104, all of or portions of top surfaces of the under-bump patterns 140 may be exposed.

Conductive terminals 400 may be correspondingly formed on the exposed top surfaces of the under-bump patterns 140. The formation of the conductive terminals 400 may include performing a solder-ball attaching process. A semiconductor package 11 may thus be fabricated.

Referring back to FIGS. 1A and 1B, the semiconductor package 11 may be turned upside down. For example, the first surface DP1$a$ of the first insulative pattern DP1 may become a top surface, and the second surface DP1$b$ of the first insulative pattern DP1 may become a bottom surface.

The third via part 130V may include a second body portion BP2 that extends parallel to the third wire part 130W, and may also include second protrusion portions PP2 that extend from the second body portion BP2 into the second recess region RR2. The second protrusion portions PP2 may be interposed between the second insulative pattern DP2 and the second wire part 120W of the second redistribution pattern 120. The second protrusion portions PP2 may be in contact with a sidewall of the second insulative pattern DP2. For example, the second insulative pattern DP2 may be interposed between the second redistribution pattern 120 and the third redistribution pattern 130. The second protrusion portions PP2 may be in contact with inclined inner walls of the second wire part 120W. An interval between the second protrusion portions PP2 may be substantially the same as a third width W3 which will be discussed below. For example, the interval between the first protrusion portions PP1 may be less than the interval between the second protrusion portions PP2. The second protrusion portions PP2 may be integrally formed with each other.

The second insulative pattern DP2 may have a third surface DP2$a$ in contact with the second via part 120V. The second insulative pattern DP2 may have a fourth surface DP2$b$ opposite to the third surface DP2$a$. The second insulative pattern DP2 may have a third width W3 at the third surface DP2$a$ and a fourth width W4 at the fourth surface DP2$b$. For example, the third width W3 may be greater than the fourth width W4. In another example, not illustrated, the third width W3 may be substantially the same as the fourth width W4. The third width W3 may range, for example, from about 20 μm to about 400 μm. The first width W1 may be less than the third width W3. A fifth width W5 may be given as a minimum width of the third recess region RR3. The fifth width W5 may be given as a minimum width of the under-bump pattern 140. For example, the fifth width W5 may be less than the third width W3.

Figure 3:
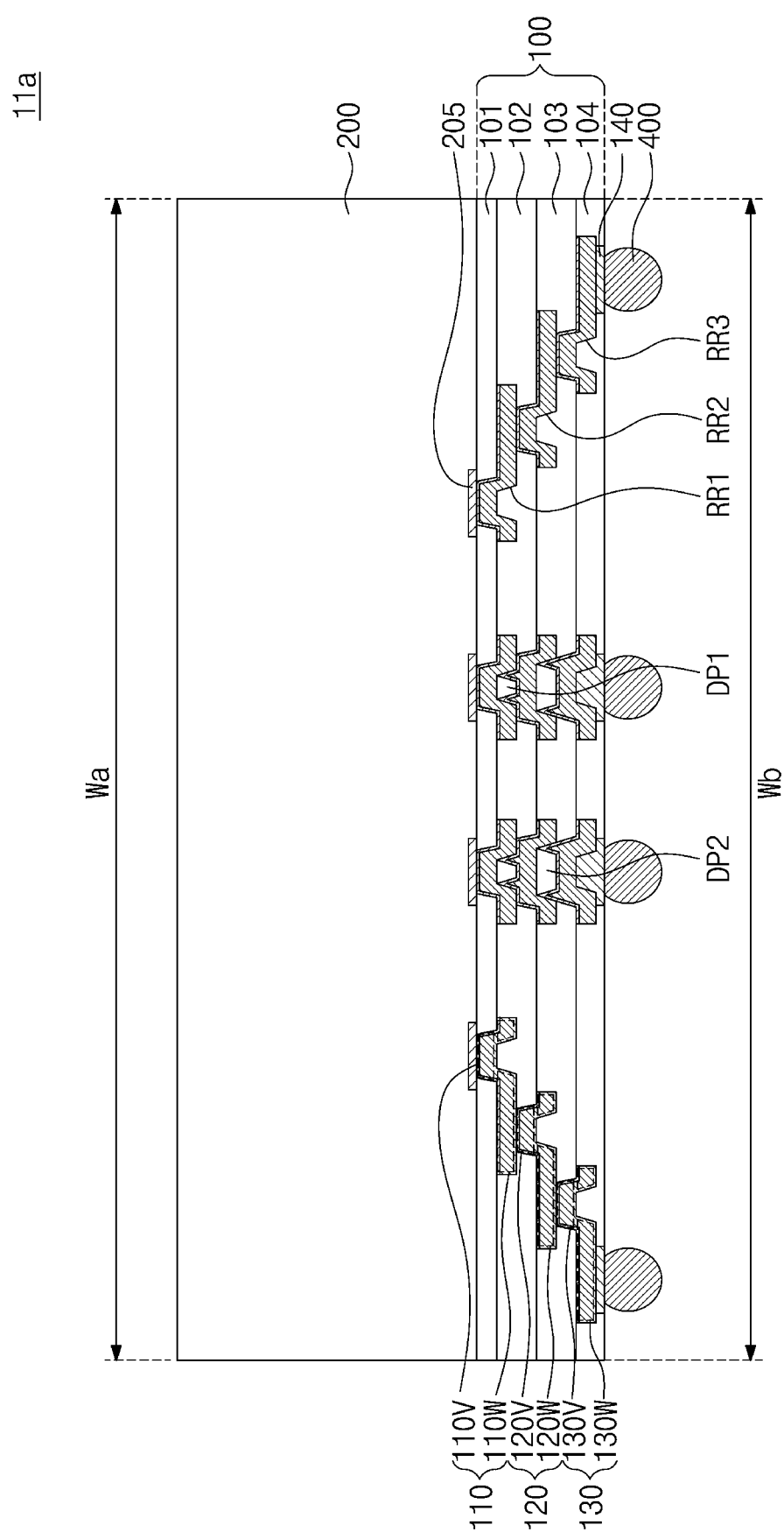
FIG. 3 illustrates a cross-sectional view showing a semiconductor package according to some example embodiments of the present disclosure.

FIG. 3 illustrates a cross-sectional view showing a semiconductor package according to some example embodiments of the present disclosure. A duplicate description will be omitted below.

Referring to FIG. 3, a semiconductor package 11$a$ may include the redistribution substrate 100 and the semiconductor chip 200. Unlike the semiconductor package 11 of FIG. 3F, the molding layer 300 may be omitted. The semiconductor chip 200 may have a width Wa substantially the same as a width Wb of the redistribution substrate 100. For example, according to some example embodiments of the present disclosure, the semiconductor package 11a may be a fan-in semiconductor package. The formation of the redistribution substrate 100 may be substantially the same as that discussed above with reference to FIGS. 2A to 2I.

FIGS. 4A to 4D illustrate cross-sectional views showing a method of fabricating a semiconductor package according to some example embodiments of the present disclosure.

Figure 4A:
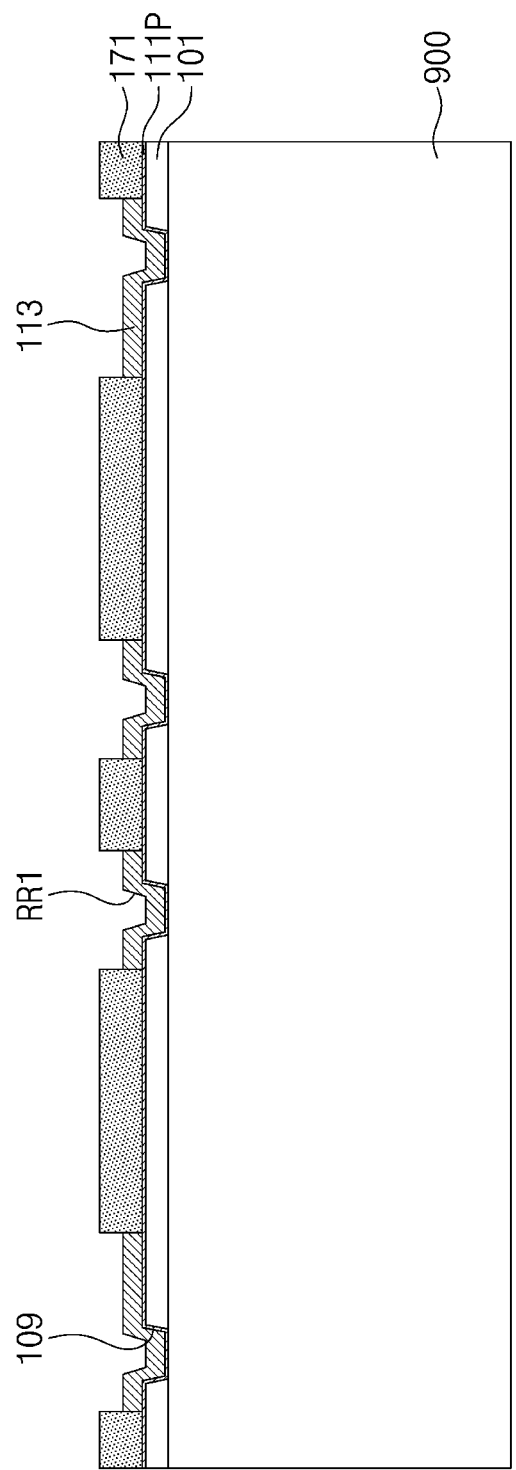
FIGS. 4A to 4D illustrate cross-sectional views showing a method of fabricating a semiconductor package according to some example embodiments of the present disclosure.

Referring to FIG. 4A, a first dielectric layer 101 may be formed on a carrier substrate 900. The first dielectric layer 101 may cover one surface of the carrier substrate 900. The formation of the first dielectric layer 101 may be performed by a coating process, such as spin coating or slit coating. The first dielectric layer 101 may include or may be formed of, for example, a photosensitive polymer. The photosensitive polymer may include or may be formed of, for example, one or more of photosensitive polyimide, polybenzoxazole, phenolic polymers, and benzocyclobutene polymers.

The first dielectric layer 101 may be patterned to form a first hole 109 in the first dielectric layer 101. The patterning of the first dielectric layer 101 may be performed by exposure and development processes. The first hole 109 may have a tapered shape. For example, the first hole 109 may have a diameter or width that is greater at its upper portion than at its lower portion. The first hole 109 may define an inner wall of the first dielectric layer 101. As the first hole 109 has a tapered shape, an obtuse angle may be provided between the inner wall of the first dielectric layer 101 and the one surface of the carrier substrate 900. The first hole 109 may be formed in plural.

A first seed layer 111P, a first resist pattern 171, and first conductive layers 113 may be formed on a top surface of the first dielectric layer 101. According to some example embodiments, the first seed layer 111P may be formed on the first dielectric layer 101 and in the first holes 109. The first seed layer 111P may conformally cover the top surface of the first dielectric layer 101, the inner wall of the first dielectric layer 101, and an exposed top surface of the carrier substrate 900.

The first resist pattern 171 may be formed on the first seed layer 111P. The formation of the first resist pattern 171 may include coating a photoresist material onto the first seed layer 111P. The first resist pattern 171 may be patterned to form first openings. The patterning of the first resist pattern 171 may be performed by exposure and development processes. The first openings may vertically overlap corresponding first holes 109. The first openings may have their widths greater than those of the corresponding first holes 109. Alternatively, the first openings may have their lengths greater than those of the corresponding first holes 109. Each of the first openings may have a sidewall substantially perpendicular to a bottom surface thereof. Each of the first openings may expose a portion of the first seed layer 111P.

The first conductive layers 113 may be formed in corresponding first holes 109, covering the first seed layer 111P. The first conductive layers 113 may correspondingly fill lower portions of the first openings. For example, the first conductive layers 113 may fill the corresponding first holes 109, and may not extend onto a top surface of the first resist pattern 171. The first conductive layers 113 may be formed by performing an electroplating process in which the first seed layer 111P is used as an electrode. A planarization process may not be separately performed during the formation of the first conductive layers 113.

A first recess region RR1 may be defined on each of the first conductive layers 113. The first recess region RR1 may extend toward the first hole 109. The first recess region RR1 may vertically overlap the first hole 109. The first recess region RR1 may define an inner wall of the first conductive layer 113. The first recess region RR1 may have a width that is greater at its upper portion than at its lower portion. The first recess region RR1 may have a tapered shape.

Figure 4B:
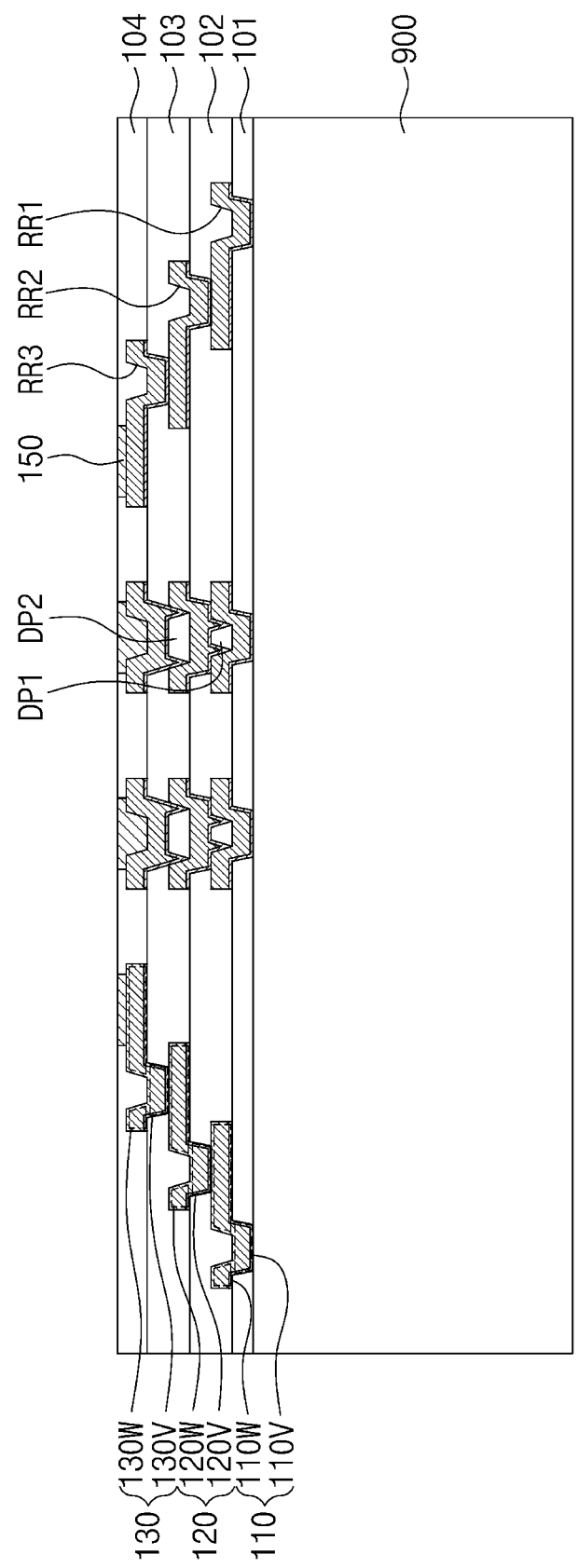

Referring to FIG. 4B, the carrier substrate 900 may be provided thereon with a first redistribution pattern 110, a second redistribution pattern 120, a third redistribution pattern 130, a first insulative pattern DP1, a second insulative pattern DP2, a second dielectric layer 102, a third dielectric layer 103, and a fourth dielectric layer 104. The first redistribution pattern 110, the second redistribution pattern 120, the third redistribution pattern 130, the first insulative pattern DP1, the second insulative pattern DP2, the second dielectric layer 102, the third dielectric layer 103, and the fourth dielectric layer 104 may be formed by using methods substantially the same as those discussed with reference to FIGS. 2A to 2I.

Bonding pads 150 may be formed in the fourth dielectric layer 104. The bonding pads 150 may be formed on top surfaces of the third redistribution patterns 130. The bonding pads 150 may fill the third recess regions RR3 that correspond to the insulative patterns DP1 and DP2. The fourth dielectric layer 104 may cover none of or only portions of the top surfaces of bonding pads 150. For example, all of or portions of the top surfaces of bonding pads 150 may be exposed. At least one bonding pad 150 may be vertically aligned with the first and second insulative patterns DP1 and DP2.

Figure 4C:
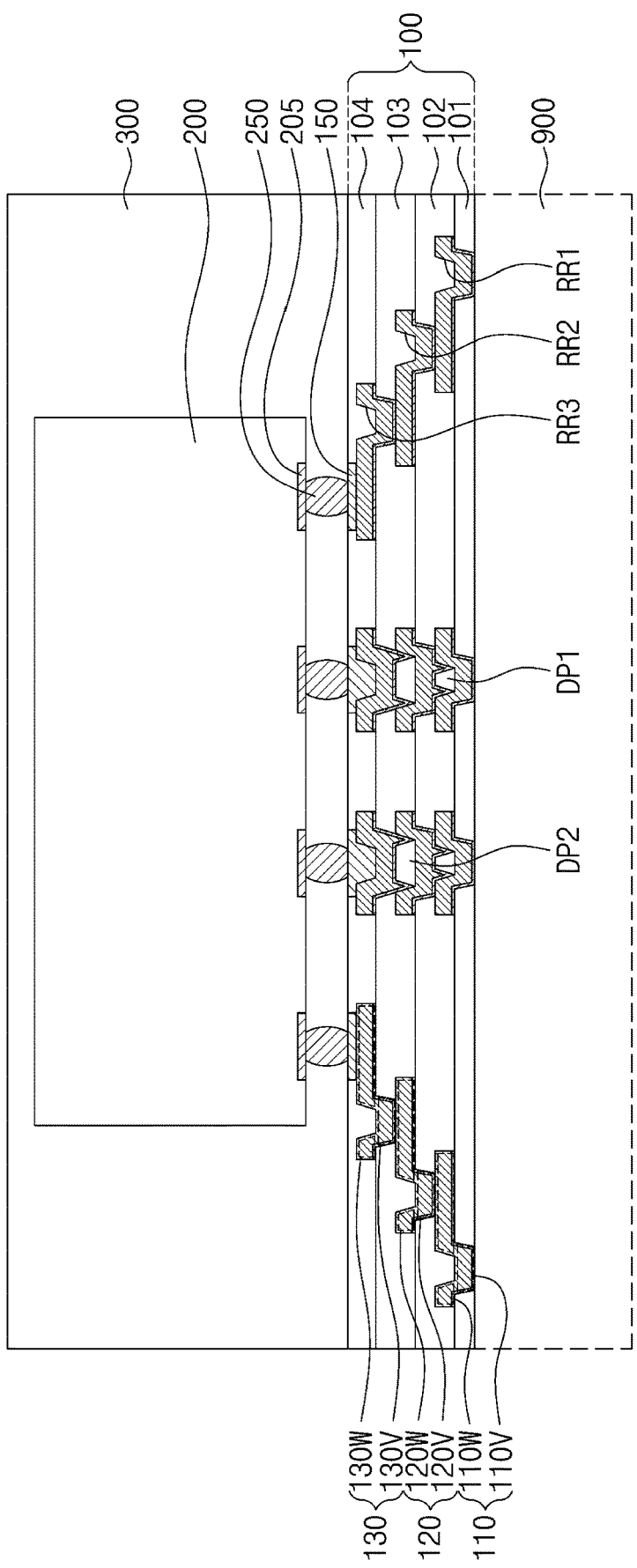

Referring to FIG. 4C, a semiconductor chip 200 may be prepared which has a plurality of chip pads 205. The semiconductor chip 200 may be disposed on the fourth dielectric layer 104 so as to align the chip pads 205 with the bonding pads 150. A plurality of bonding terminals 250 may be formed between the semiconductor chip 200 and the redistribution substrate 100. The bonding terminals 250 may be correspondingly coupled to the chip pads 205 and the bonding pads 150.

A molding layer 300 may be formed on the fourth dielectric layer 104, thereby encapsulating the semiconductor chip 200. The molding layer 300 may further extend into a gap between the fourth dielectric layer 104 and the semiconductor chip 200, thereby encapsulating the bonding terminals 250.

The carrier substrate 900 may be removed from the first dielectric layer 101. Therefore, the first dielectric layer 101 may be exposed at its bottom surface, and the first redistribution patterns 110 may be exposed at their bottom surfaces.

Figure 4D:
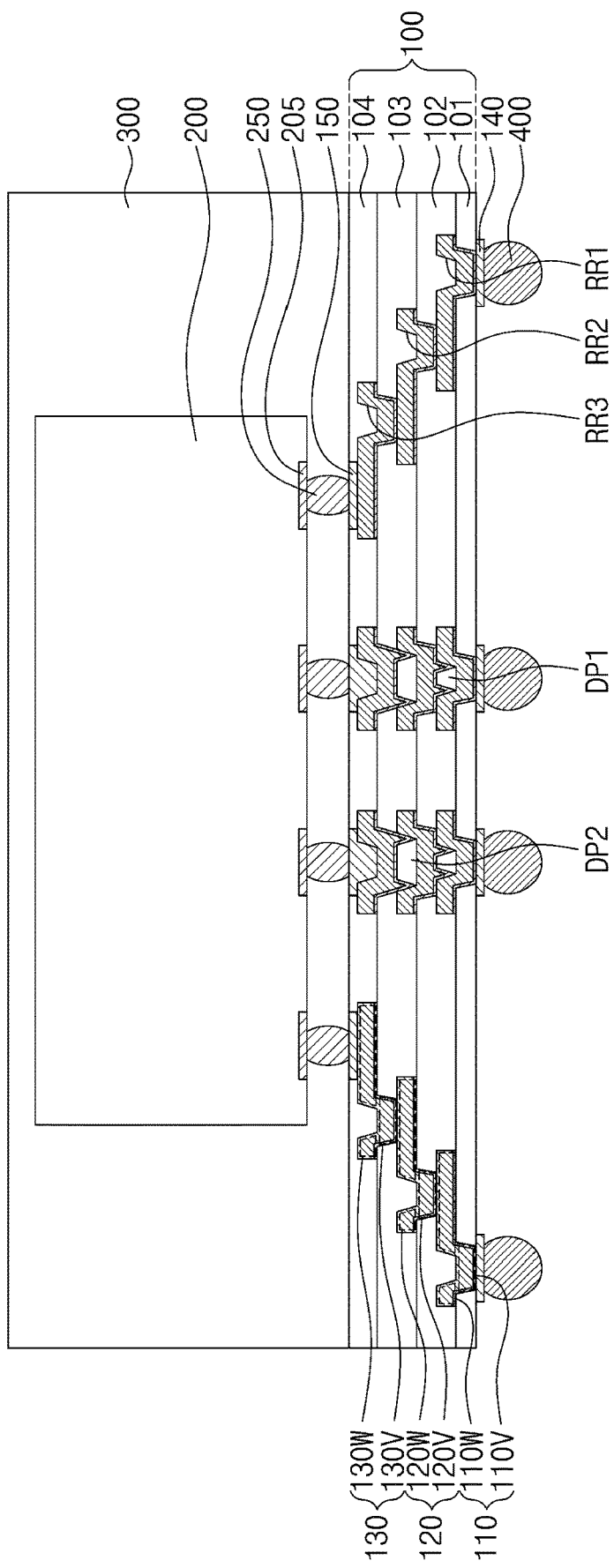

Referring to FIG. 4D, under-bump patterns 140 may be formed on the bottom surface of the first redistribution pattern 110. The under-bump patterns 140 may be coupled to the exposed first via part 110V of the first redistribution pattern 110.

Conductive terminals 400 may be correspondingly formed on bottom surfaces of the under-bump patterns 140. The formation of the conductive terminals 400 may include performing a solder-ball attaching process. A semiconductor package 11b may thus be fabricated.

The following will discuss a single semiconductor package for brevity of description, but methods of fabricating semiconductor packages are not limited to chip-level fabrication. For example, semiconductor packages may be fabricated at a chip, panel, or wafer level.

Figure 5:
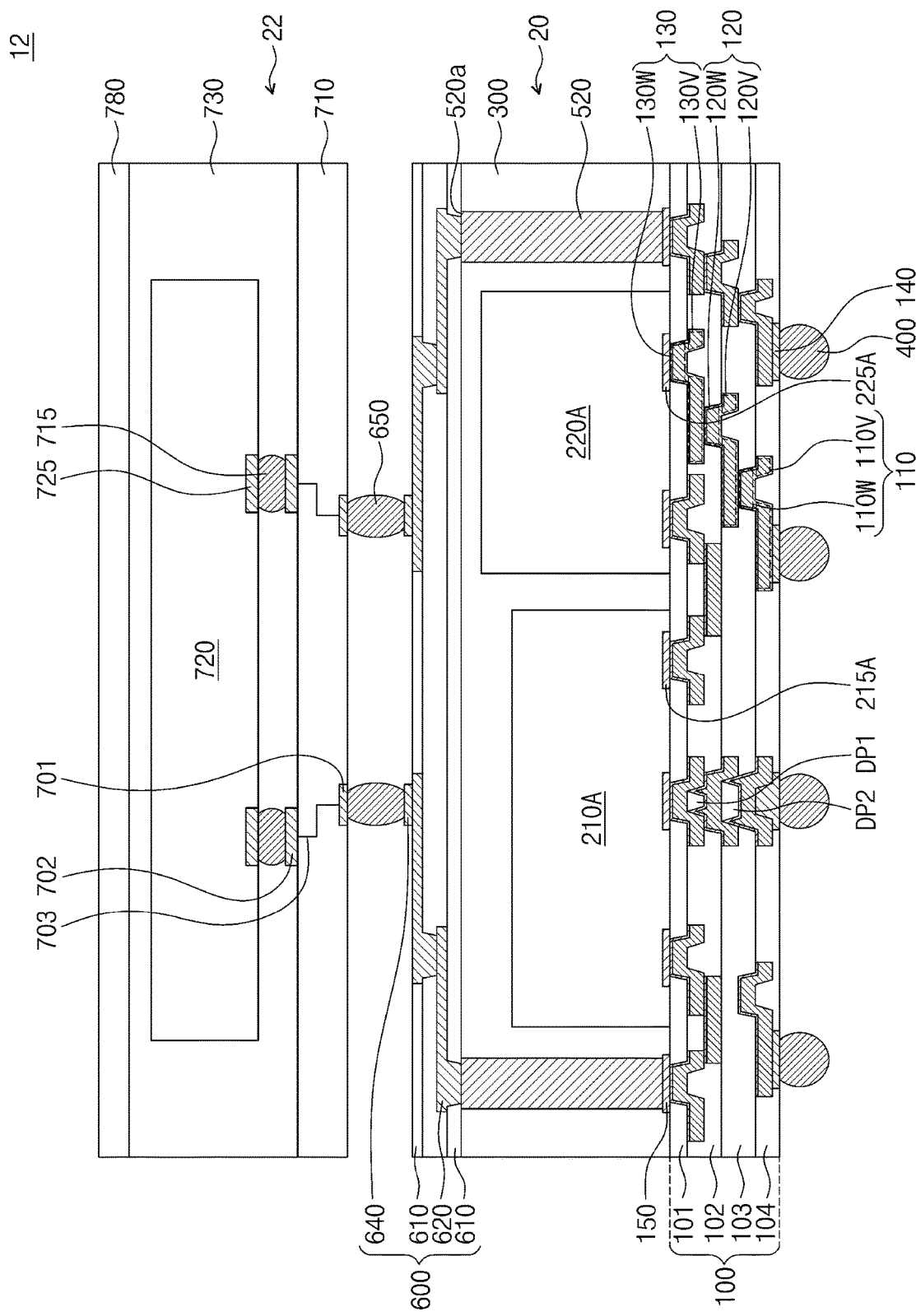
FIG. 5 illustrates a cross-sectional view showing a semiconductor package according to some example embodiments of the present disclosure.

FIG. 5 illustrates a cross-sectional view showing a semiconductor package according to some example embodiments of the present disclosure. A duplicate description will be omitted below.

Referring to FIG. 5, a semiconductor package 12 may include a lower semiconductor package 20 and an upper semiconductor package 22. The lower semiconductor package 20 may include a redistribution substrate 100, a conductive terminal 400, a first semiconductor chip 210A, a second semiconductor chip 220A, a molding layer 300, and a conductive structure 520. The redistribution substrate 100, the conductive terminal 400, and the molding layer 300 may be substantially the same as those discussed with reference to FIGS. 1A and 1B.

The second semiconductor chip 220A may be laterally spaced apart from the first semiconductor chip 210A. The second semiconductor chip 220A may be of a different type from the first semiconductor chip 210A. For example, the first semiconductor chip 210A may include one of a logic chip, a memory chip, and a power management chip, and the second semiconductor chip 220A may include another of a logic chip, a memory chip, and a power management chip. The logic chip may include an applicant specific integrated circuit (ASIC) chip or an application processor (AP) chip. The ASIC chip may include an application specific integrated circuit (ASIC). The power management chip may include a power management integrated circuit (PMIC). For example, the first semiconductor chip 210A may be an ASIC chip, and the second semiconductor chip 220A may be a power management chip. Each of the first and second semiconductor chips 210A and 220A may be similar to the semiconductor chip 200 discussed with reference to FIGS. 1A and 1B. Differently from that shown, the second semiconductor chip 220A may be omitted. In another example, a third semiconductor chip may further be mounted on a top surface of the redistribution substrate 100.

Chip pads 215A of the first semiconductor chip 210A and chip pads 225A of the second semiconductor chip 220A may be electrically connected through first redistribution patterns 110 to the redistribution substrate 100. Therefore, the second semiconductor chip 220A may be electrically connected through the redistribution substrate 100 to the first semiconductor chip 210A.

The conductive structure 520 may be disposed on the top surface of the redistribution substrate 100. The conductive structure 520 may be electrically connected through a bonding pad 150 to the first redistribution pattern 110. The conductive structure 520 may be laterally spaced apart from the first and second semiconductor chips 210A and 220A. When viewed in plan view, the conductive structure 520 may be provided on an edge of the redistribution substrate 100. A metal pillar may be provided on the redistribution substrate 100, forming the conductive structure 520. For example, the conductive structure 520 may be the metal pillar. The conductive structure 520 may be electrically connected to the redistribution substrate 100. For example, the conductive structure 520 may be electrically connected through the redistribution substrate 100 to the first semiconductor chip 210A, the second semiconductor chip 220A, or the conductive terminal 400. The conductive structure 520 may include or may be formed of a metal, such as copper.

The molding layer 300 may be provided on the top surface of the redistribution substrate 100 and may cover the first and second semiconductor chips 210A and 220A. The molding layer 300 may surround sidewalls of the conductive structure 520. The molding layer 300 may be provided between the first and second semiconductor chips 210A and 220A, between the first semiconductor chip 210A and the conductive structure 520, and between the second semiconductor chip 220A and the conductive structure 520. The molding layer 300 may cover none of or only portions of a top surface 520a of the conductive structure 520. For example, subsequent to providing the molding layer 300, all of or portions of top surface 520a of the conductive structure 520 may be exposed.

The lower semiconductor package 20 may further include an upper redistribution layer 600. The upper redistribution layer 600 may be provided on a top surface of the molding layer 300. The upper redistribution layer 600 may include upper dielectric patterns 610, upper redistribution patterns 620, and upper bonding pads 640. The upper dielectric patterns 610 may be stacked on the molding layer 300. The upper dielectric patterns 610 may include or may be formed of a photosensitive polymer. Each of the upper redistribution patterns 620 may include a via part in the upper dielectric pattern 610 and a wire part between the upper dielectric patterns 610. The upper redistribution patterns 620 may include or may be formed of a metal, such as copper. At least one of the upper redistribution patterns 620 may be in contact with the top surface 520a of the conductive structure 520. Therefore, the upper redistribution patterns 620 may be coupled to the conductive structure 520. The upper bonding pad 640 may be disposed on an uppermost one of the upper dielectric patterns 610, and may be coupled to the upper redistribution patterns 620. The upper bonding pad 640 may be electrically connected through the upper redistribution patterns 620 and the conductive structure 520 to the conductive terminal 400, the first semiconductor chip 210A, or the second semiconductor chip 220A. The presence of the upper redistribution patterns 620 may allow the upper bonding pad 640 to not vertically align with the conductive structure 520.

The upper semiconductor package 22 may be disposed on the lower semiconductor package 20. For example, the upper semiconductor package 22 may be placed on the upper redistribution layer 600. The upper semiconductor package 22 may include an upper substrate 710, an upper semiconductor chip 720, and an upper molding layer 730. The upper substrate 710 may be a printed circuit board. Alternatively, the upper substrate 710 may be a redistribution layer. For example, the upper substrate 710 may be manufactured by an example for fabricating the redistribution substrate 100 discussed with reference to FIGS. 2A to 2I. A first connection pad 701 and a second connection pad 702 may be respectively disposed on a bottom surface and a top surface of the upper substrate 710. The upper substrate 710 may be provided therein with a wiring line 703 coupled to the first and second connection pads 701 and 702. The wiring line 703 is schematically illustrated and may be variously changed in shape and arrangement. The first connection pad 701, the second connection pad 702, and the wiring line 703 may include or may be formed of a conductive material, such as metal.

The upper semiconductor chip 720 may be disposed on the upper substrate 710. The upper semiconductor chip 720 may include integrated circuits (not shown), which integrated circuits may include a memory circuit, a logic circuit, or a combination thereof. The upper semiconductor chip 720 may be of a different type from the first and second semiconductor chips 210A and 220A. For example, the upper semiconductor chip 720 may be a memory chip. A bump terminal 715 may be interposed between the upper substrate 710 and the upper semiconductor chip 720, and may be coupled to the second connection pad 702 and a chip pad 725 of the upper semiconductor chip 720. The upper semiconductor chip 720 may be electrically connected to the first connection pad 701 through the bump terminal 715 and the wiring line 703. Differently from that shown, the bump terminal 715 may be omitted, and the chip pad 725 may be directly coupled to the second connection pad 702.

The upper substrate 710 may be provided thereon with the upper molding layer 730 that covers the upper semiconductor chip 720. The upper molding layer 730 may include or may be formed of a dielectric polymer, such as an epoxy-based polymer.

The upper semiconductor package 22 may further include a thermal radiation structure 780. The thermal radiation structure 780 may include a heat sink, a heat slug, or a thermal interface material (TIM) layer. The thermal radiation structure 780 may include or may be formed of, for example, metal. The thermal radiation structure 780 may be disposed on a top surface of the upper molding layer 730. The thermal radiation structure 780 may further extend onto a sidewall of the upper molding layer 730 or a sidewall of the molding layer 300.

The semiconductor package 12 may further include a connection terminal 650. The connection terminal 650 may be interposed between and coupled to the upper bonding pad 640 and the first connection pad 701. In such a configuration, the upper semiconductor package 22 may be electrically connected through the connection terminal 650 to the first semiconductor chip 210A, the second semiconductor chip 220A, and the conductive terminal 400. The electrical connection of the upper semiconductor package 22 may mean an electrical connection with integrated circuits in the upper semiconductor chip 720.

In another example, the upper substrate 710 may be omitted, and the connection terminal 650 may be directly coupled to the chip pad 725 of the upper semiconductor chip 720. In this case, the upper molding layer 730 may be in contact with a top surface of the upper redistribution layer 600. Alternatively, the upper substrate 710 and the connection terminal 650 may be omitted, and the chip pad 725 of the upper semiconductor chip 720 may be directly coupled to the upper bonding pad 640.

Figure 6A:
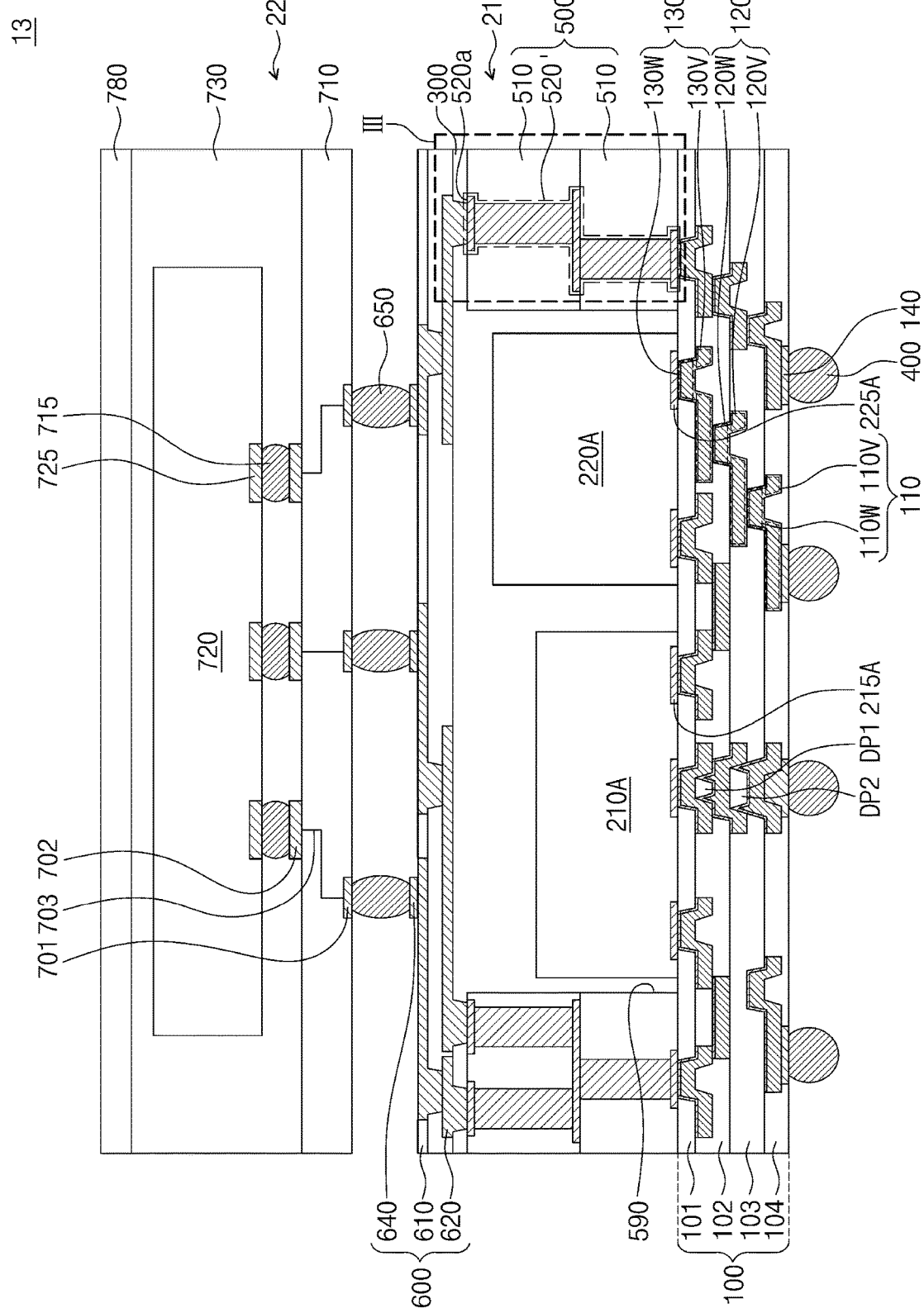
FIG. 6A illustrates a cross-sectional view showing a semiconductor package according to some example embodiments of the present disclosure.
Figure 6B:
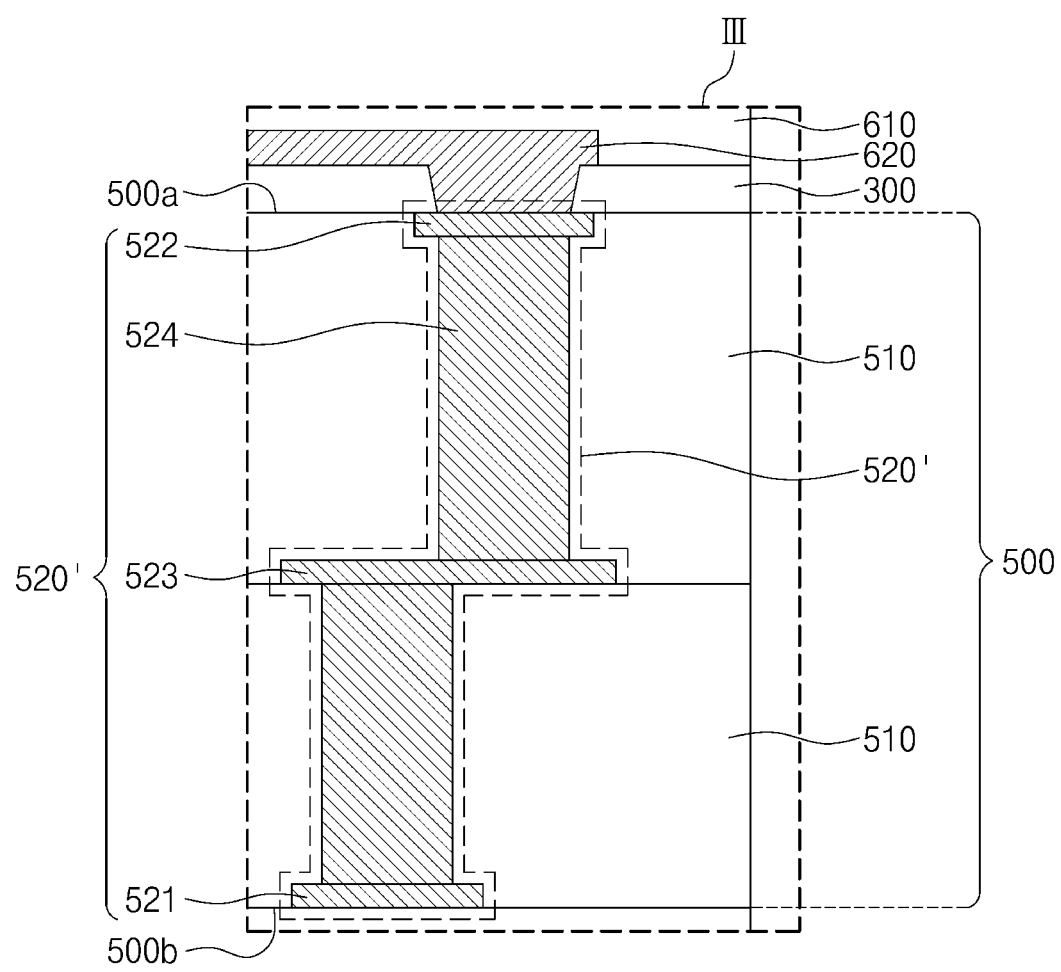
FIG. 6B illustrates an enlarged view showing section III of FIG. 6A.

FIG. 6A illustrates a cross-sectional view showing a semiconductor package according to some example embodiments of the present disclosure. FIG. 6B illustrates an enlarged view showing section III of FIG. 6A. A duplicate description will be omitted below.

Referring to FIGS. 6A and 6B, a semiconductor package 13 may include a lower semiconductor package 21 and an upper semiconductor package 22. The lower semiconductor package 21 may include a redistribution substrate 100, a conductive terminal 400, a first semiconductor chip 210A, a second semiconductor chip 220A, a molding layer 300, and a connection substrate 500. The redistribution substrate 100, the conductive terminal 400, and the molding layer 300 may be substantially the same as those discussed with reference to FIGS. 1A and 1B. The first semiconductor chip 210A and the second semiconductor chip 220A may be substantially the same as the first semiconductor chip 210A and the second semiconductor chip 220A discussed in FIG. 5.

The connection substrate 500 may be disposed on the redistribution substrate 100. The connection substrate 500 may have a substrate hole 590 that penetrates therethrough. For example, the substrate hole 590 may be formed to penetrate top and bottom surfaces of a printed circuit board, and thus the connection substrate 500 may be fabricated.

When viewed in plan, the substrate hole 590 may be formed on a central portion of the redistribution substrate 100. The first and second semiconductor chips 210A and 220A may be disposed in the substrate hole 590 of the connection substrate 500. The first and second semiconductor chips 210A and 220A may be spaced apart from an inner wall of the connection substrate 500.

The connection substrate 500 may include a base layer 510 and a conductive structure 520'. The base layer 510 may include a plurality of stacked base layers. The stacked base layers 510 may include a dielectric material. For example, the stacked base layers 510 may include or may be formed of a carbon-based material, a ceramic, or a polymer. The substrate hole 590 may penetrate the stacked base layers 510. The conductive structure 520' may be provided in the stacked base layers 510. The conductive structure 520' may include a first pad 521, a conductive line 523, vias 524, and a second pad 522. The first pad 521 may be exposed on a bottom surface 500b of the connection substrate 500. The conductive line 523 may be interposed between the stacked base layers 510. The vias 524 may penetrate the stacked base layers 510 and may be coupled to the conductive line 523. The second pad 522 may be exposed on a top surface 500a of the connection substrate 500 and may be coupled to one of the vias 524. The second pad 522 may be electrically connected to the first pad 521 through the vias 524 and the conductive line 523. The second pad 522 may not be vertically aligned with the first pad 521. The number of second pads 522 may be different from the number of first pads 521. The conductive structure 520' may include metal. The conductive structure 520' may include, for example, at least one selected from copper, aluminum, tungsten, titanium, tantalum, iron, and any alloy thereof.

The molding layer 300 may be provided on the first semiconductor chip 210A, the second semiconductor chip 220A, and the connection substrate 500. The molding layer 300 may be interposed between the first semiconductor chip 210A and the second semiconductor chip 220A, between the first semiconductor chip 210A and the connection substrate 500, and between the second semiconductor chip 220A and the connection substrate 500. According to some example embodiments, an adhesive dielectric film may be attached to a top surface of the connection substrate 500, top surfaces of the first and second semiconductor chips 210A and 220A, and sidewalls of the first and second semiconductor chips 210A and 220A, thereby forming the molding layer 300. For example, an ajinomoto build-up film (ABF) may be used as the adhesive dielectric film. For another example, the molding layer 300 may include a dielectric polymer, such as an epoxy-based polymer.

The lower semiconductor package 21 may further include an upper redistribution layer 600. The upper redistribution layer 600 may be disposed on the molding layer 300 and the connection substrate 500. The upper redistribution layer 600 may include upper dielectric patterns 610, upper redistribution patterns 620, and upper bonding pads 640. The upper dielectric patterns 610, the upper redistribution patterns 620, and the upper bonding pads 640 may be substantially the same as those discussed above in the example of FIG. 5. In contrast, at least one of the upper redistribution patterns 620 may extend into the molding layer 300, and may thus be coupled to the second pad 522.

The upper semiconductor package 22 may be disposed on the lower semiconductor package 21. For example, the upper semiconductor package 22 may be placed on the upper redistribution layer 600. The upper semiconductor package 22 may include an upper substrate 710, an upper semiconductor chip 720, and an upper molding layer 730. The upper semiconductor package 22 and the connection terminal 650 may be substantially the same as those discussed in FIG. 4. For example, the connection terminal 650 may be interposed between the lower semiconductor package 21 and the upper semiconductor package 22. The upper semiconductor package 22 may further include a thermal radiation structure 780.

According to the present disclosure, insulative patterns may be interposed between redistribution patterns. Therefore, there may be a reduction in depth of a region where the redistribution patterns are recessed. Accordingly, it may be possible to prevent failure of a conductive terminal that electrically connects a redistribution substrate to an external circuit. In conclusion, the redistribution substrate and a semiconductor package including the same may exhibit increased reliability.

Although the present inventive concepts have been described in connection with example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
 a redistribution substrate;
 a semiconductor chip on a first surface of the redistribution substrate, the semiconductor chip including a chip pad electrically connected to the redistribution substrate; and
 a conductive terminal on a second surface, opposite the first surface, of the redistribution substrate,
 wherein the redistribution substrate includes:
  a first dielectric layer;
  a second dielectric layer in contact with the first dielectric layer;
  a third dielectric layer in contact with the second dielectric layer;
  a first redistribution pattern in the first dielectric layer and the second dielectric layer;
  a second redistribution pattern in the second dielectric layer and the third dielectric layer; and
  a first insulative pattern formed in a first recess region of the first redistribution pattern,
 wherein the first redistribution pattern is interposed between and electrically connects the chip pad and the second redistribution pattern,
 wherein the first insulative pattern has a first surface in contact with the first redistribution pattern and a second surface in contact with the second redistribution pattern, the second surface being opposite to the first surface, and
 wherein a width at the first surface of the first insulative pattern is the same as or greater than a width at the second surface of the first insulative pattern.

2. The semiconductor package of claim 1, further comprising:
 a fourth dielectric layer in contact with the third dielectric layer;
 a third redistribution pattern in the third dielectric layer and the fourth dielectric layer; and
 a second insulative pattern formed in a second recess region of the second redistribution pattern,
 wherein the second insulative pattern has a third surface in contact with the second redistribution pattern and a fourth surface in contact with the third redistribution pattern, the fourth surface being opposite to the third surface, and
 wherein a width at the third surface of the second insulative pattern is the same as or greater than a width at the fourth surface of the second insulative pattern.

3. The semiconductor package of claim 2, wherein each of the first to third redistribution patterns includes:
 a wire part on one surface of a corresponding one of the first to third dielectric layers, the wire part extending parallel to the one surface of the corresponding one of the first to third dielectric layers; and
 a via part that extends from the wire part and penetrates the corresponding one of the first to third dielectric layers.

4. The semiconductor package of claim 3, further comprising:
 an under bump pattern formed in a third recess region of the third redistribution pattern including,
 wherein the under bump pattern has a fifth surface located at a level substantially the same as a level of the one surface of the third dielectric layer.

5. The semiconductor package of claim 4, wherein a depth of the third recess region is about 3 μm to about 20 μm.

6. The semiconductor package of claim 3, wherein the second redistribution pattern is in contact with at least a portion of a bottom surface of the wire part included in the first redistribution pattern.

7. The semiconductor package of claim 3, wherein the via part of the second redistribution pattern includes:
 a first body portion that extends parallel to the wire part of the second redistribution pattern; and
 first protrusion portions that extend from the first body portion into the first recess region, the first protrusion portions being in contact with sidewalls of the wire part of the first redistribution pattern.

8. The semiconductor package of claim 7, wherein the via part of the third redistribution pattern includes:
 a second body portion that extends parallel to the wire part of the third redistribution pattern; and
 second protrusion portions that extend from the second body portion into the second recess region, the second protrusion portions being in contact with sidewalls of the wire part of the second redistribution pattern,
 wherein an interval between the first protrusion portions is less than an interval between the second protrusion portions.

9. The semiconductor package of claim 7, wherein the first protrusion portions are interposed between the first insulative pattern and the wire part of the first redistribution pattern.

10. The semiconductor package of claim 2, wherein a maximum width of the second insulative pattern is about 20 μm to about 400 μm.

11. A semiconductor package, comprising:
 a redistribution substrate;
 a semiconductor chip on a first surface of the redistribution substrate, the semiconductor chip including a chip pad electrically connected to the redistribution substrate; and
 a conductive terminal on a second surface, opposite the first surface, of the redistribution substrate,
 wherein the redistribution substrate includes:
  a first dielectric layer, a second dielectric layer, a third dielectric layer, and a fourth dielectric layer that are sequentially provided in a direction from the first surface toward the second surface of the redistribution substrate;

a first redistribution pattern in the first dielectric layer and the second dielectric layer, a second redistribution pattern in the second dielectric layer and the third dielectric layer, and a third redistribution pattern in the third dielectric layer and the fourth dielectric layer, the first to third redistribution patterns being sequentially provided along the direction and being connected to each other, each of the first to third redistribution patterns including a wire part that extends parallel to one surface of a corresponding one of the first to third dielectric layers, a via part that extends from the wire part and penetrates the corresponding one of the first to third dielectric layers, and a recess region in the wire part;

a first insulative pattern in the recess region of the first redistribution pattern; and a second insulative pattern in the recess region of the second redistribution pattern, wherein the first insulative pattern has a first surface in contact with the via part of the first redistribution pattern, wherein the second insulative pattern has a second surface in contact with the via part of the second redistribution pattern, and wherein a width at the first surface of the first insulative pattern is less than a width at the second surface of the second insulative pattern.

12. The semiconductor package of claim 11, wherein the first insulative pattern further has a third surface opposite to the first surface and in contact with the second redistribution pattern, the second insulative pattern further has a fourth surface opposite to the second surface and in contact with the third redistribution pattern, the width at the first surface of the first insulative pattern is the same as or greater than a width at the third surface of the first insulative pattern, and the width at the second surface of the second insulative pattern is the same as or greater than a width at the fourth surface of the second insulative pattern.

13. The semiconductor package of claim 11, wherein the via part of each of the second and third redistribution patterns includes:

a body portion that extends parallel to the wire part of the each of the second and third redistribution patterns; and protrusion portions that extend from the body portion in a direction from the second surface toward the first surface of the redistribution substrate.

14. The semiconductor package of claim 11, wherein the first insulative pattern is located at a level the same as a level of the wire part of the first redistribution pattern, and the second insulative pattern is located at a level the same as a level of the wire part of the second redistribution pattern.

15. The semiconductor package of claim 11, wherein a maximum width of the second insulative pattern is about 20 μm to about 400 μm.

16. A semiconductor package, comprising:
a redistribution substrate;

a semiconductor chip on a first surface of the redistribution substrate, the semiconductor chip including a chip pad electrically connected to the redistribution substrate;

a molding layer that covers the semiconductor chip; and a conductive terminal on a second surface, opposite to the first surface, of the redistribution substrate, wherein the redistribution substrate includes:
a dielectric layer;

first, second, and third redistribution patterns in the dielectric layer and sequentially provided in a first direction from the first surface toward the second surface of the redistribution substrate, each of the first to third redistribution patterns including a wire part that extends parallel to one surface of the dielectric layer, a via part that extends from the wire part in a direction opposite to the first direction, and a recess region in the wire part;

an under-bump pattern in the recess region of the third redistribution pattern and electrically connected to the conductive terminal;

a first insulative pattern in the recess region of the first redistribution pattern; and a second insulative pattern in the recess region of the second redistribution pattern, wherein the first insulative pattern has a first surface in contact with the via part of the first redistribution pattern and a second surface in contact with the second redistribution pattern, the second surface being opposite to the first surface, wherein the second insulative pattern has a third surface in contact with the via part of the second redistribution pattern and a fourth surface in contact with the third redistribution pattern, the fourth surface being opposite to the third surface, where a width at the first surface of the first insulative pattern is the same as or greater than a width at the second surface of the first insulative pattern, and wherein a width at the third surface of the second insulative pattern is the same as or greater than a width at the fourth surface of the second insulative pattern.

17. The semiconductor package of claim 16, wherein a minimum width of the under-bump pattern is less than the width at the third surface of the second insulative pattern.

18. The semiconductor package of claim 16, wherein the via part of the second redistribution pattern includes:

a first body portion that extends parallel to the wire part of the second redistribution pattern; and first protrusion portions that extend from the first body portion into the recess region of the first redistribution pattern, and the via part of the third redistribution pattern includes:

a second body portion that extends parallel to the wire part of the third redistribution pattern; and second protrusion portions that extend from the second body portion into the recess region of the second redistribution pattern.

19. The semiconductor package of claim 18, wherein the first body portion of the second redistribution pattern is in contact with at least a portion of a bottom surface of the wire part included in the first redistribution pattern.

20. The semiconductor package of claim 16, wherein the first and second insulative patterns include a material the same as a material of the dielectric layer.

* * * * *